(12) United States Patent
Millward et al.

(10) Patent No.: US 8,669,645 B2
(45) Date of Patent: Mar. 11, 2014

(54) SEMICONDUCTOR STRUCTURES INCLUDING POLYMER MATERIAL PERMEATED WITH METAL OXIDE

(75) Inventors: Dan B. Millward, Boise, ID (US); Timothy A. Quick, Boise, ID (US); J. Neil Greeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/335,107

(22) Filed: Dec. 22, 2011

(65) Prior Publication Data

US 2012/0133017 A1    May 31, 2012

Related U.S. Application Data

(62) Division of application No. 12/259,921, filed on Oct. 28, 2008, now Pat. No. 8,097,175.

(51) Int. Cl.
*H01L 23/58* (2006.01)

(52) U.S. Cl.
USPC ............ 257/638; 257/639; 257/646; 257/649

(58) Field of Classification Search
USPC ............ 257/506, 501, E29.02, 507, 508, 638, 257/639, 649; 428/188, 451, 702
See application file for complete search history.

(56) References Cited

U.S. PATENT DOCUMENTS

| | | | |
|---|---|---|---|
| 4,623,674 A | 11/1986 | Bailey | |
| 4,797,357 A | 1/1989 | Mura et al. | |
| 4,877,647 A | 10/1989 | Klabunde | |
| 5,328,810 A | 7/1994 | Lowrey et al. | |
| 5,374,367 A | 12/1994 | Edamura et al. | |
| 5,382,373 A | 1/1995 | Carlson | |
| 5,482,656 A | 1/1996 | Hiraoka et al. | |
| 5,512,131 A | 4/1996 | Kumar et al. | |

(Continued)

FOREIGN PATENT DOCUMENTS

| CN | 1562730 | 1/2005 |
|---|---|---|
| CN | 1799131 A | 7/2006 |

(Continued)

OTHER PUBLICATIONS

Huang et al., "Stretchable gold conductors on elastomeric substrates," Applied Physics Letters, vol. 82, No. 15, p. 2404.

(Continued)

*Primary Examiner* — Walter H Swanson
*Assistant Examiner* — Wilner Jean Baptiste
(74) *Attorney, Agent, or Firm* — TraskBritt

(57) ABSTRACT

Methods of forming metal oxide structures and methods of forming metal oxide patterns on a substrate using a block copolymer system formulated for self-assembly. A block copolymer at least within a trench in the substrate and including at least one soluble block and at least one insoluble block may be annealed to form a self-assembled pattern including a plurality of repeating units of the at least one soluble block laterally aligned with the trench and positioned within a matrix of the at least one insoluble block. The self-assembled pattern may be exposed to a metal oxide precursor that impregnates the at least one soluble block. The metal oxide precursor may be oxidized to form a metal oxide. The self-assembled pattern may be removed to form a pattern of metal oxide lines on the substrate surface. Semiconductor device structures are also described.

20 Claims, 4 Drawing Sheets

(56) References Cited

U.S. PATENT DOCUMENTS

| | | |
|---|---|---|
| 5,538,655 A | 7/1996 | Fauteux et al. |
| 5,580,700 A | 12/1996 | Rahman |
| 5,620,850 A | 4/1997 | Bamdad et al. |
| 5,622,668 A | 4/1997 | Thomas et al. |
| 5,772,905 A | 6/1998 | Chou |
| 5,834,583 A | 11/1998 | Hancock et al. |
| 5,849,810 A | 12/1998 | Mueller et al. |
| 5,879,582 A | 3/1999 | Havelka et al. |
| 5,879,853 A | 3/1999 | Azuma |
| 5,891,356 A | 4/1999 | Inoue et al. |
| 5,904,824 A | 5/1999 | Oh et al. |
| 5,925,259 A | 7/1999 | Biebuyck et al. |
| 5,948,470 A | 9/1999 | Harrison et al. |
| 5,958,704 A | 9/1999 | Starzl et al. |
| 6,051,869 A * | 4/2000 | Pan et al. ............... 257/506 |
| 6,111,323 A | 8/2000 | Carter et al. |
| 6,143,647 A | 11/2000 | Pan et al. |
| 6,153,495 A | 11/2000 | Kub et al. |
| 6,207,787 B1 | 3/2001 | Fahey et al. |
| 6,270,946 B1 | 8/2001 | Miller |
| 6,309,580 B1 | 10/2001 | Chou |
| 6,310,138 B1 | 10/2001 | Yonezawa et al. |
| 6,312,971 B1 | 11/2001 | Amundson et al. |
| 6,368,871 B1 | 4/2002 | Christel et al. |
| 6,403,382 B1 | 6/2002 | Zhu et al. |
| 6,414,164 B1 | 7/2002 | Afzali-Ardakani et al. |
| 6,423,465 B1 | 7/2002 | Hawker et al. |
| 6,423,474 B1 | 7/2002 | Holscher |
| 6,503,841 B1 | 1/2003 | Criscuolo et al. |
| 6,506,660 B2 | 1/2003 | Holmes et al. |
| 6,517,933 B1 | 2/2003 | Soane et al. |
| 6,518,194 B2 | 2/2003 | Winningham et al. |
| 6,537,920 B1 | 3/2003 | Krivokapic |
| 6,548,830 B1 | 4/2003 | Noguchi et al. |
| 6,565,763 B1 | 5/2003 | Asakawa et al. |
| 6,565,764 B2 | 5/2003 | Hiraoka et al. |
| 6,566,248 B1 | 5/2003 | Wang et al. |
| 6,569,528 B2 | 5/2003 | Nam et al. |
| 6,573,030 B1 | 6/2003 | Fairbairn et al. |
| 6,592,764 B1 | 7/2003 | Stucky et al. |
| 6,630,520 B1 | 10/2003 | Bruza et al. |
| 6,635,912 B2 | 10/2003 | Ohkubo |
| 6,656,308 B2 | 12/2003 | Hougham et al. |
| 6,679,996 B1 | 1/2004 | Yao |
| 6,682,660 B2 | 1/2004 | Sucholeiki et al. |
| 6,689,473 B2 | 2/2004 | Guire et al. |
| 6,699,797 B1 | 3/2004 | Morris et al. |
| 6,713,238 B1 | 3/2004 | Chou et al. |
| 6,746,825 B2 | 6/2004 | Nealey et al. |
| 6,767,693 B1 | 7/2004 | Okoroanyanwu |
| 6,780,492 B2 | 8/2004 | Hawker et al. |
| 6,781,166 B2 | 8/2004 | Lieber et al. |
| 6,797,202 B2 | 9/2004 | Endo et al. |
| 6,809,210 B2 | 10/2004 | Chandross |
| 6,812,132 B2 | 11/2004 | Ramachandrarao et al. |
| 6,825,358 B2 | 11/2004 | Afzali-Ardakani et al. |
| 6,884,842 B2 | 4/2005 | Soane et al. |
| 6,887,332 B1 | 5/2005 | Kagan et al. |
| 6,890,624 B1 | 5/2005 | Kambe et al. |
| 6,890,703 B2 | 5/2005 | Hawker et al. |
| 6,908,861 B2 | 6/2005 | Sreenivasan et al. |
| 6,911,400 B2 | 6/2005 | Colburn et al. |
| 6,913,697 B2 | 7/2005 | Lopez et al. |
| 6,924,341 B2 | 8/2005 | Mays et al. |
| 6,926,953 B2 | 8/2005 | Nealey et al. |
| 6,940,485 B2 | 9/2005 | Noolandi |
| 6,946,332 B2 | 9/2005 | Loo et al. |
| 6,949,456 B2 | 9/2005 | Kumar |
| 6,952,436 B2 | 10/2005 | Wirnsberger et al. |
| 6,957,608 B1 | 10/2005 | Hubert et al. |
| 6,962,823 B2 | 11/2005 | Empedocles et al. |
| 6,989,426 B2 | 1/2006 | Hu |
| 6,992,115 B2 | 1/2006 | Hawker et al. |
| 6,995,439 B1 | 2/2006 | Hill et al. |
| 6,998,152 B2 | 2/2006 | Uhlenbrock |
| 7,001,795 B2 | 2/2006 | Jiang et al. |
| 7,009,227 B2 | 3/2006 | Patrick et al. |
| 7,030,495 B2 | 4/2006 | Colburn et al. |
| 7,037,738 B2 | 5/2006 | Sugiyama et al. |
| 7,037,744 B2 | 5/2006 | Colburn et al. |
| 7,045,851 B2 | 5/2006 | Black et al. |
| 7,056,455 B2 | 6/2006 | Matyjaszewski et al. |
| 7,056,849 B2 | 6/2006 | Wan et al. |
| 7,060,774 B2 | 6/2006 | Sparrowe et al. |
| 7,066,801 B2 * | 6/2006 | Balijepalli et al. ............ 451/526 |
| 7,077,992 B2 | 7/2006 | Sreenivasan et al. |
| 7,087,267 B2 | 8/2006 | Breen et al. |
| 7,090,784 B2 | 8/2006 | Asakawa et al. |
| 7,112,617 B2 | 9/2006 | Kim et al. |
| 7,115,305 B2 | 10/2006 | Bronikowski et al. |
| 7,115,525 B2 | 10/2006 | Abatchev et al. |
| 7,115,995 B2 | 10/2006 | Wong |
| 7,118,784 B1 | 10/2006 | Xie |
| 7,119,321 B2 | 10/2006 | Quinlan |
| 7,132,370 B2 | 11/2006 | Paraschiv et al. |
| 7,135,144 B2 | 11/2006 | Christel et al. |
| 7,135,241 B2 | 11/2006 | Ferraris et al. |
| 7,135,388 B2 | 11/2006 | Ryu et al. |
| 7,135,523 B2 | 11/2006 | Ho et al. |
| 7,151,209 B2 | 12/2006 | Empedocles et al. |
| 7,163,712 B2 | 1/2007 | Chilkoti et al. |
| 7,166,304 B2 | 1/2007 | Harris et al. |
| 7,172,953 B2 | 2/2007 | Lieber et al. |
| 7,186,613 B2 | 3/2007 | Kirner et al. |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,195,733 B2 | 3/2007 | Rogers et al. |
| 7,202,308 B2 | 4/2007 | Boussand et al. |
| 7,208,836 B2 * | 4/2007 | Manning ............... 257/758 |
| 7,252,791 B2 | 8/2007 | Wasserscheid et al. |
| 7,259,101 B2 | 8/2007 | Zurcher et al. |
| 7,279,396 B2 | 10/2007 | Derderian et al. |
| 7,282,240 B1 | 10/2007 | Jackman et al. |
| 7,291,284 B2 | 11/2007 | Mirkin et al. |
| 7,326,514 B2 | 2/2008 | Dai et al. |
| 7,332,370 B2 | 2/2008 | Chang et al. |
| 7,332,627 B2 | 2/2008 | Chandross et al. |
| 7,338,275 B2 | 3/2008 | Choi et al. |
| 7,347,953 B2 | 3/2008 | Black et al. |
| 7,368,314 B2 | 5/2008 | Ufert |
| 7,407,887 B2 | 8/2008 | Guo |
| 7,408,186 B2 | 8/2008 | Merkulov et al. |
| 7,419,772 B2 | 9/2008 | Watkins et al. |
| 7,470,954 B2 | 12/2008 | Lee et al. |
| 7,514,339 B2 | 4/2009 | Yang et al. |
| 7,521,090 B1 | 4/2009 | Cheng et al. |
| 7,553,760 B2 | 6/2009 | Yang et al. |
| 7,569,855 B2 | 8/2009 | Lai |
| 7,585,741 B2 * | 9/2009 | Manning ............... 438/396 |
| 7,592,247 B2 | 9/2009 | Yang et al. |
| 7,605,081 B2 | 10/2009 | Yang et al. |
| 7,632,544 B2 | 12/2009 | Ho et al. |
| 7,655,383 B2 | 2/2010 | Mela et al. |
| 7,658,773 B2 | 2/2010 | Pinnow |
| 7,700,157 B2 | 4/2010 | Bronikowski et al. |
| 7,767,099 B2 | 8/2010 | Li et al. |
| 7,888,228 B2 | 2/2011 | Blanchard |
| 7,959,975 B2 | 6/2011 | Millward |
| 7,964,107 B2 | 6/2011 | Millward |
| 8,039,196 B2 | 10/2011 | Kim et al. |
| 8,083,953 B2 | 12/2011 | Millward et al. |
| 8,097,175 B2 | 1/2012 | Millward et al. |
| 8,101,261 B2 | 1/2012 | Millward et al. |
| 8,114,300 B2 | 2/2012 | Millward |
| 2001/0024768 A1 | 9/2001 | Matsuo et al. |
| 2001/0049195 A1 | 12/2001 | Chooi et al. |
| 2002/0055239 A1 | 5/2002 | Tuominen et al. |
| 2002/0084429 A1 | 7/2002 | Craighead et al. |
| 2002/0158342 A1 | 10/2002 | Tuominen et al. |
| 2002/0167117 A1 | 11/2002 | Chou |
| 2003/0010241 A1 | 1/2003 | Fujihira et al. |
| 2003/0034329 A1 | 2/2003 | Chou |
| 2003/0068639 A1 | 4/2003 | Haneder et al. |

(56) References Cited

U.S. PATENT DOCUMENTS

| | | |
|---|---|---|
| 2003/0077452 A1 | 4/2003 | Guire et al. |
| 2003/0080471 A1 | 5/2003 | Chou |
| 2003/0080472 A1 | 5/2003 | Chou |
| 2003/0091752 A1 | 5/2003 | Nealey et al. |
| 2003/0100822 A1 | 5/2003 | Lew et al. |
| 2003/0108879 A1 | 6/2003 | Klaerner et al. |
| 2003/0143375 A1 | 7/2003 | Noguchi et al. |
| 2003/0157248 A1 | 8/2003 | Watkins et al. |
| 2003/0178707 A1 | 9/2003 | Abbott |
| 2003/0180522 A1 | 9/2003 | DeSimone et al. |
| 2003/0180966 A1 | 9/2003 | Abbott et al. |
| 2003/0185741 A1 | 10/2003 | Matyjaszewski et al. |
| 2003/0222048 A1* | 12/2003 | Asakawa et al. ............... 216/2 |
| 2003/0235930 A1 | 12/2003 | Bao et al. |
| 2004/0023287 A1 | 2/2004 | Harnack et al. |
| 2004/0028875 A1 | 2/2004 | Van Rijn et al. |
| 2004/0058059 A1 | 3/2004 | Linford et al. |
| 2004/0076757 A1 | 4/2004 | Jacobson et al. |
| 2004/0084298 A1 | 5/2004 | Yao et al. |
| 2004/0124092 A1 | 7/2004 | Black et al. |
| 2004/0125266 A1 | 7/2004 | Miyauchi et al. |
| 2004/0127001 A1 | 7/2004 | Colburn et al. |
| 2004/0142578 A1 | 7/2004 | Wiesner et al. |
| 2004/0159633 A1 | 8/2004 | Whitesides et al. |
| 2004/0163758 A1 | 8/2004 | Kagan et al. |
| 2004/0175628 A1 | 9/2004 | Nealey et al. |
| 2004/0192013 A1 | 9/2004 | Ryu et al. |
| 2004/0222415 A1 | 11/2004 | Chou et al. |
| 2004/0242688 A1 | 12/2004 | Chandross et al. |
| 2004/0254317 A1 | 12/2004 | Hu |
| 2004/0256615 A1 | 12/2004 | Sirringhaus et al. |
| 2004/0256662 A1 | 12/2004 | Black et al. |
| 2004/0265548 A1 | 12/2004 | Ho et al. |
| 2005/0008828 A1 | 1/2005 | Libera et al. |
| 2005/0062165 A1 | 3/2005 | Saenger et al. |
| 2005/0074706 A1 | 4/2005 | Bristol et al. |
| 2005/0079486 A1 | 4/2005 | Abbott et al. |
| 2005/0100830 A1 | 5/2005 | Xu et al. |
| 2005/0120902 A1 | 6/2005 | Adams et al. |
| 2005/0124135 A1 | 6/2005 | Ayazi et al. |
| 2005/0133697 A1 | 6/2005 | Potyrailo et al. |
| 2005/0147841 A1 | 7/2005 | Tavkhelidze |
| 2005/0167651 A1 | 8/2005 | Merkulov et al. |
| 2005/0176256 A1 | 8/2005 | Kudelka |
| 2005/0208752 A1 | 9/2005 | Colburn et al. |
| 2005/0238889 A1 | 10/2005 | Iwamoto et al. |
| 2005/0238967 A1 | 10/2005 | Rogers et al. |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0024590 A1 | 2/2006 | Sandhu |
| 2006/0030495 A1 | 2/2006 | Gregg, Jr. |
| 2006/0035387 A1 | 2/2006 | Wagner et al. |
| 2006/0038182 A1 | 2/2006 | Rogers et al. |
| 2006/0046079 A1 | 3/2006 | Lee et al. |
| 2006/0046480 A1 | 3/2006 | Guo |
| 2006/0060863 A1 | 3/2006 | Lu et al. |
| 2006/0062867 A1 | 3/2006 | Choi et al. |
| 2006/0078681 A1 | 4/2006 | Hieda et al. |
| 2006/0097134 A1 | 5/2006 | Rhodes |
| 2006/0105562 A1 | 5/2006 | Yi |
| 2006/0124467 A1 | 6/2006 | Ho et al. |
| 2006/0128165 A1 | 6/2006 | Theiss et al. |
| 2006/0134556 A1 | 6/2006 | Nealey et al. |
| 2006/0137554 A1 | 6/2006 | Kron et al. |
| 2006/0141222 A1* | 6/2006 | Fischer et al. ............... 428/172 |
| 2006/0141245 A1 | 6/2006 | Stellacci et al. |
| 2006/0154466 A1 | 7/2006 | Lee et al. |
| 2006/0163646 A1 | 7/2006 | Black et al. |
| 2006/0192283 A1 | 8/2006 | Benson |
| 2006/0205875 A1 | 9/2006 | Cha et al. |
| 2006/0211871 A1 | 9/2006 | Dai et al. |
| 2006/0217285 A1 | 9/2006 | Destarac |
| 2006/0228635 A1 | 10/2006 | Suleski |
| 2006/0231525 A1 | 10/2006 | Asakawa et al. |
| 2006/0249784 A1 | 11/2006 | Black et al. |
| 2006/0249796 A1 | 11/2006 | Tavkhelidze et al. |
| 2006/0254440 A1 | 11/2006 | Choi et al. |
| 2006/0255505 A1 | 11/2006 | Sandhu et al. |
| 2006/0257633 A1 | 11/2006 | Inoue et al. |
| 2006/0258159 A1 | 11/2006 | Colburn et al. |
| 2006/0278158 A1 | 12/2006 | Tolbert et al. |
| 2006/0281266 A1 | 12/2006 | Wells |
| 2006/0286305 A1 | 12/2006 | Thies et al. |
| 2006/0286490 A1 | 12/2006 | Sandhu et al. |
| 2006/0292777 A1 | 12/2006 | Dunbar |
| 2007/0020749 A1 | 1/2007 | Nealey et al. |
| 2007/0023247 A1 | 2/2007 | Ulicny et al. |
| 2007/0023805 A1 | 2/2007 | Wells et al. |
| 2007/0045562 A1 | 3/2007 | Parekh |
| 2007/0045642 A1 | 3/2007 | Li |
| 2007/0071881 A1 | 3/2007 | Chua et al. |
| 2007/0072403 A1 | 3/2007 | Sakata |
| 2007/0122749 A1 | 5/2007 | Fu et al. |
| 2007/0122932 A1 | 5/2007 | Kodas et al. |
| 2007/0138131 A1 | 6/2007 | Burdinski |
| 2007/0161237 A1 | 7/2007 | Lieber et al. |
| 2007/0175859 A1 | 8/2007 | Black et al. |
| 2007/0181870 A1 | 8/2007 | Libertino et al. |
| 2007/0183035 A1 | 8/2007 | Asakawa et al. |
| 2007/0194403 A1* | 8/2007 | Cannon et al. ............... 257/506 |
| 2007/0200477 A1 | 8/2007 | Tuominen et al. |
| 2007/0208159 A1 | 9/2007 | McCloskey et al. |
| 2007/0218202 A1 | 9/2007 | Ajayan et al. |
| 2007/0222995 A1 | 9/2007 | Lu |
| 2007/0224819 A1 | 9/2007 | Sandhu |
| 2007/0224823 A1 | 9/2007 | Sandhu |
| 2007/0227383 A1 | 10/2007 | Decre et al. |
| 2007/0249117 A1 | 10/2007 | Kang et al. |
| 2007/0272951 A1 | 11/2007 | Lieber et al. |
| 2007/0281220 A1 | 12/2007 | Sandhu et al. |
| 2007/0289943 A1 | 12/2007 | Lu et al. |
| 2007/0293041 A1 | 12/2007 | Yang |
| 2008/0032238 A1 | 2/2008 | Lu et al. |
| 2008/0038923 A1 | 2/2008 | Edelstein et al. |
| 2008/0041818 A1 | 2/2008 | Kihara et al. |
| 2008/0047930 A1 | 2/2008 | Blanchet et al. |
| 2008/0064217 A1 | 3/2008 | Horii |
| 2008/0073743 A1 | 3/2008 | Alizadeh et al. |
| 2008/0083991 A1 | 4/2008 | Yang et al. |
| 2008/0085601 A1 | 4/2008 | Park et al. |
| 2008/0093743 A1 | 4/2008 | Yang et al. |
| 2008/0102252 A1 | 5/2008 | Black et al. |
| 2008/0103256 A1 | 5/2008 | Kim et al. |
| 2008/0113169 A1 | 5/2008 | Cha et al. |
| 2008/0164558 A1 | 7/2008 | Yang et al. |
| 2008/0174726 A1 | 7/2008 | Kim |
| 2008/0176767 A1 | 7/2008 | Millward |
| 2008/0193658 A1 | 8/2008 | Millward |
| 2008/0217292 A1 | 9/2008 | Millward et al. |
| 2008/0233297 A1 | 9/2008 | de Jong et al. |
| 2008/0233323 A1 | 9/2008 | Cheng et al. |
| 2008/0257187 A1 | 10/2008 | Millward |
| 2008/0260941 A1 | 10/2008 | Jin |
| 2008/0274413 A1 | 11/2008 | Millward |
| 2008/0286659 A1 | 11/2008 | Millward |
| 2008/0311347 A1 | 12/2008 | Millward et al. |
| 2008/0315270 A1 | 12/2008 | Marsh et al. |
| 2008/0318005 A1 | 12/2008 | Millward |
| 2009/0062470 A1 | 3/2009 | Millward et al. |
| 2009/0155579 A1 | 6/2009 | Greco et al. |
| 2009/0200646 A1 | 8/2009 | Millward et al. |
| 2009/0206489 A1 | 8/2009 | Li et al. |
| 2009/0212016 A1* | 8/2009 | Cheng et al. ............... 216/67 |
| 2009/0218567 A1 | 9/2009 | Mathew et al. |
| 2009/0236309 A1 | 9/2009 | Millward et al. |
| 2009/0240001 A1* | 9/2009 | Regner ............... 525/95 |
| 2009/0263628 A1 | 10/2009 | Millward |
| 2009/0267058 A1 | 10/2009 | Namdas et al. |
| 2009/0274887 A1 | 11/2009 | Millward et al. |
| 2009/0317540 A1 | 12/2009 | Sandhu et al. |
| 2010/0092873 A1 | 4/2010 | Sills et al. |

(56) References Cited

U.S. PATENT DOCUMENTS

| | | |
|---|---|---|
| 2010/0102415 A1 | 4/2010 | Millward et al. |
| 2010/0124826 A1 | 5/2010 | Millward et al. |
| 2010/0137496 A1 | 6/2010 | Millward et al. |
| 2010/0163180 A1 | 7/2010 | Millward |
| 2010/0204402 A1 | 8/2010 | Millward et al. |
| 2010/0279062 A1 | 11/2010 | Millward et al. |
| 2010/0316849 A1 | 12/2010 | Millward et al. |
| 2010/0323096 A1 | 12/2010 | Sills et al. |
| 2011/0232515 A1 | 9/2011 | Millward |
| 2012/0133017 A1 | 5/2012 | Millward et al. |
| 2012/0223053 A1 | 9/2012 | Millward et al. |

FOREIGN PATENT DOCUMENTS

| | | |
|---|---|---|
| CN | 101013662 A | 8/2007 |
| EP | 0784543 B1 | 4/2000 |
| EP | 1416303 A2 | 5/2004 |
| EP | 1906237 | 2/2008 |
| EP | 1593164 B1 | 6/2010 |
| JP | 11080414 | 3/1999 |
| JP | 2003155365 | 5/2003 |
| JP | 2004335962 | 11/2004 |
| JP | 2006036923 | 2/2005 |
| JP | 2005029779 | 3/2005 |
| JP | 2006055982 | 3/2006 |
| JP | 2006110434 | 4/2006 |
| JP | 2005008882 | 7/2006 |
| JP | 2007194175 | 8/2007 |
| JP | 2008-036491 | 2/2008 |
| KR | 1020060128378 | 12/2006 |
| KR | 20070029762 A | 3/2007 |
| KR | 100771886 B1 | 11/2007 |
| TW | 200400990 | 3/1992 |
| TW | 200633925 | 10/1994 |
| TW | 200740602 | 1/1996 |
| TW | 584670 B | 4/2004 |
| TW | 200419017 | 10/2004 |
| TW | 200511364 | 3/2005 |
| TW | 256110 | 6/2006 |
| TW | 1253456 | 11/2007 |
| TW | 200802421 | 1/2008 |
| WO | 90/07575 | 7/1990 |
| WO | 97/06013 | 2/1997 |
| WO | 98/39645 A1 | 9/1998 |
| WO | 99/47570 | 9/1999 |
| WO | 0031183 A1 | 6/2000 |
| WO | 0218080 | 3/2002 |
| WO | 02/081372 A2 | 10/2002 |
| WO | 03045840 | 6/2003 |
| WO | 2005/122285 A2 | 12/2005 |
| WO | 2006003592 | 1/2006 |
| WO | 2006003594 | 1/2006 |
| WO | 2006/076016 | 7/2006 |
| WO | 2006/078952 | 7/2006 |
| WO | 2006112887 | 10/2006 |
| WO | 2007/001294 | 1/2007 |
| WO | 2007/013889 A2 | 2/2007 |
| WO | 2007/019439 A3 | 2/2007 |
| WO | 2007/024241 | 3/2007 |
| WO | 2007/024323 A2 | 3/2007 |
| WO | 2007/055041 | 5/2007 |
| WO | 2008055137 | 5/2008 |
| WO | 2008/091741 A2 | 7/2008 |
| WO | 2008/096335 A2 | 8/2008 |
| WO | 2008/097736 A2 | 8/2008 |
| WO | 2008/118635 A2 | 10/2008 |
| WO | 2008/124219 A2 | 10/2008 |
| WO | 2008/130847 A1 | 10/2008 |
| WO | 2008/145268 A1 | 12/2008 |
| WO | 2008/156977 A2 | 12/2008 |
| WO | 2009/099924 A2 | 8/2009 |
| WO | 2009/102551 A2 | 8/2009 |
| WO | 2009/117238 A2 | 9/2009 |
| WO | 2009/117243 A1 | 9/2009 |
| WO | 2009/134635 A2 | 11/2009 |

OTHER PUBLICATIONS

Trimbach et al., "Block Copolymer Thermoplastic Elastomers for Microcontact Printing," Langmuir, 2003, vol. 19, p. 10957.

Tadd et al, Spatial Distribution of Cobalt Nanoclusters in Block Copolymers, Langmuir, vol. 18, pp. 2378-2384 (2002). [Published on Web Feb. 8, 2002].

Written Opinion of the International Searching Authority for International Application No. PCT/US2009/062117 dated Jun. 1, 2010, 3 pages.

Xia et al., An Approach to Lithographically Defined Self-Assembled Nanoparticle Films, Advanced Materials, vol. 18, pp. 930-933 (2006).

Xia, Younan, et al., "Soft Lithography," Annu. Rev. Mater. Sci., vol. 28, pp. 153-184, 1998.

Xu et al., Electric Field Alignment of Symmetric Diblock Copolymer Thin Films, Department of Polymer Science and Engineering, University of Massachusetts, 5 pages (2003).

Xu et al., Interfacial Interaction Dependence of Microdomain Orientation in Diblock Copolymer Thin Films, Macromolecules, vol. 38, pp. 2802-2805 (2005).

Xu, F.J., et al., "Surface-Initiated Atom Transfer Radical Polymerization from Halogen-Terminated Si(111) (Si-X, X=Cl, Br) Surfaces for the Preparation of Well-Defined Polymer-Si Hybrids," Langmuir, vol. 21, No. 8, pp. 3221-3225, 2005.

Yamaguchi et al., Resist-Pattern Guided Self-Assembly of Symmetric Diblock Copolymer, Journal of Photopolymer Science and Technology, vol. 19, No. 3, pp. 385-388 (2006).

Yang et al., Covalently Attached Graft Polymer Monolayer on Organic Polymeric Substrate via Confined Surface Inhibition Reaction, Journal of Polymer Science—a—Polymer Chemistry Edition, Sep. 28, 2006, pp. 745-755, vol. 45, Issue 5.

Yu et al., Contact Printing Beyond Surface Roughness: Liquid Supramolecular Nanostamping, Advanced Materials, vol. 19, 2007, pp. 4338-4342. [Published online Nov. 21, 2007].

Zaumseil et al., "Three-Dimensional and Multilayer Nanostructures Formed by Nanotransfer Printing," Nano Letters, 2003, vol. 3, No. 9, pp. 1223-1227. [Published on Web Jul. 31, 2003].

Zehner, Robert W., et al., "Selective Decoration of a Phase-Separated Diblock Copolymer with Thiol-Passivated Gold Nanocrystals," Langmuir, vol. 14, No. 2, pp. 241-243, Jan. 20, 1998.

Zhang et al., "Self-Assembled Monolayers of Terminal Alkynes on Gold," J. Am. Chem. Soc., vol. 129, No. 16, pp. 4876-4877, 2007. [Published on Web Mar. 31, 2007].

Zhao et al., Colloidal Subwavelength Nanostructures for Antireflection Optical Coatings, Optics Letters, vol. 30, No. 14, pp. 1885-1887 (2005). [Jul. 15, 2005].

Zhou et al., Nanoscale Metal/Self-Assembled Monolayer/Metal Heterostructures, American Institute of Physics, pp. 611-613 (1997). [Appl Phys Lett 71(5), Aug. 4, 1997].

Zhu, X.Y., et al., "Grafting of High-Density Poly(Ethylene Glycol) Monolayers on Si(111)," Langmuir, vol. 17, pp. 7798-7803, 2001. [Published on Web Nov. 8, 2001].

Zhu, X.Y., et al., "Molecular Assemblies on Silicon Surfaces via Si—O Linkages," Langmuir, vol. 16, pp. 6766-6772, 2000. [Published on Web Jul. 29, 2000].

Asakawa et al., Fabrication of Subwavelength Structure for Improvement in Light-Extraction Efficiency of Light-Emitting Devices Using a Self-Assembled Pattern of Block Copolymer, http://www.research.ibm.com/journal/rd/515/black.html, IBM Journal of Research and Development, vol. 51, No. 5, 2007. [Applied Optics 44 (34) 7475-7482, Dec. 1, 2005].

Black et al., Integration of Self-Assembled Diblock Copolymers for Semiconductor Capacitor Fabrication, Applied Physics Letters, vol. 79, No. 3, pp. 409-411, Jul. 16, 2001.

Black et al., Polymer Self Assembly in Semiconductor Microelectronics, IBM J. Res. & Dev. vol. 51, No. 5, Sep. 2007, pp. 605-633.

(56) References Cited

OTHER PUBLICATIONS

Black, C.T., "Self-aligned self-assembly of multi-nanowire silicon field effect transistors," Appl. Phys. Lett., vol. 87, pp. 163116-1 through 163116-3, 2005.

Black, Charles T., et al., "Nanometer-Scale Pattern Registration and Alignment by Directed Diblock Copolymer Self-Assembly," IEEE Transactions on Nanotechnology, vol. 3, No. 3, pp. 412-415, Sep. 2004.

Cha et al., Biomimetic Approaches for Fabricating High-Density Nanopatterned Arrays, Chem. Mater. vol. 19, 2007, pp. 839-843. [Published on Web Jan. 20, 2007].

Chai et al., Assembly of Aligned Linear Metallic Patterns on Silicon, Nature Nanotechnology, vol. 2, Aug. 2007, pp. 500-506.

Chai et al., Using Cylindrical Domains of Block Copolymers to Self-Assemble and Align Metallic Nanowires, American Chemical Society, www.Acsnano.org, 2008. pp. A-K. [Published online Feb. 5, 2008].

Chen et al., Highly Ordered Arrays of Mesoporous Silica Nanorods with Tunable Aspect Ratios from Block Copolymer Thin Films, Advanced Materials, vol. 20, pp. 763-767, 2008.

Cho et al., Nanoporous Block Copolymer Micelle/Micelle Multilayer Films with Dual Optical Properties, J. Am. Chem. Soc., vol. 128, No. 30, pp. 9935-9942 (2006). [Published on Web Jul. 12, 2006].

Clark et al., "Selective Deposition in Multilayer Assembly: SAMs as Molecular Templates," Supramolecular Science, vol. 4, pp. 141-146, (1997).

Erlandsson, Mikael, et al., "Metallic Zinc Reduction of Disulfide Bonds between Cysteine Residues in Peptides and Proteins," International Journal of Peptide Research and Therapeutics, vol. 11, No. 4, pp. 261-265, Dec. 2005.

Fasolka et al., Block Copolymer Thin Films: Physics and Applications1, Annual Review, vol. 31, pp. 323-355 (2001).

Gates, "Nanofabrication with Molds and Stamps," Materials Today, pp. 44-49, (Feb. 2005).

Grubbs, Hybrid Metal-Polymer Composites from Functional Block Copolymers, Journal of Polymer Science: Part A: Polymer Chemistry, vol. 43, pp. 4323-4336 (2005).

Guarini et al., Nanoscale Patterning Using Self-Assembled Polymers for Semiconductor Applications, J. Vac. Sci. Technol. B 19(6), pp. 2784-2788, Nov./Dec. (2001).

Hadziioannou, Semiconductor Block Copolymers for Self-Assembled Photovoltaic Devices, MRS Bulletin, pp. 456-460 (2002).

Hamers, Robert J., "Passivation and activation: How do monovalent atoms modify the reactivity of silicon surfaces? A perspective on the article, 'The mechanism of amine formation on Si(100) activated with chlorine atoms,'" Surface Science, vol. 600, pp. 3361-3362, 2006. [Available online Jun. 9, 2006].

Hayward et al., Crosslinked Poly(styrene)-block-Poly(2-vinylpyridine) Thin Films as Swellable Templates for Mesostructured Silica and Titania, Advanced Materials, vol. 17, 2005, pp. 2591-2595. [Published online Sep. 15,].

Helmuth, Jo A., et al., "High-Speed Microcontact Printing," J. Am. Chem. Soc., vol. 128, No. 29, pp. 9296-9297, 2006. [Published on Web Jun. 29, 2006].

Horiuchi et al., Three-Dimensional Nanoscale Alignment of Metal Nanoparticles Using Block Copolymer Films as Nanoreactors, Langmuir, vol. 19, pp. 2963-2973 (2003). [Published on Web Feb. 28, 2003].

Huang et al., "Using Surface Active Random Copolymers to Control the Domain Orientation in Diblock Copolymer Thin Films," Macromolecules, 1998, 31, 7641-7650. [Published on Web Oct. 10, 1998].

Hur et al., "Nanotransfer printing by use of noncovalent surface forces: Applications to thin-film transistors that use single-walled carbon nanotube networks and semiconducting polymers," Applied Physics Letters, vol. 85, No. 23, Dec. 6, 2004, pp. 5730-5732.

International Search Report for International Application No. PCT/US2009/062117 dated Jun. 1, 2010, 3 pages.

Ji et al., Molecular Transfer Printing Using Block Copolymers, ACS Nano, vol. 4, No. 2, pp. 599-609, 2010. [Published online Dec. 30, 2009].

Jiang, Xingyu, et al., "Electrochemical Desorption of Self-Assembled Monolayers Noninvasively Releases Patterned Cells from Geometrical Confinements," J. Am. Chem. Soc., vol. 125, No. 9, pp. 2366-2367, 2003. [Published on Web Feb. 6, 2003].

Johnson, Daniel L., et al., "Probing the stability of the disulfide radical intermediate of thioredoxin using direct electrochemistry," Letters in Peptide Science, vol. 10, pp. 495-500, 2003.

Jun, Yongseok, et al., "Microcontact Printing Directly on the Silicon Surface," Langmuir, vol. 18, No. 9, pp. 3415-3417, 2002. [Published on Web Apr. 3, 2002].

Jun, Yongseok, et al., "Patterning protein molecules on poly(ethylene glycol) coated Si(111)," Biomaterials, vol. 25, pp. 3503-3509, 2004.

Kavakli et al., Single and Double-Layer Antireflection Coatings on Silicon, Turk J Phys, vol. 26, pp. 349-354 (2002).

Kim et al., "Epitaxial self-assembly of block copolymers on lithographically defined nanopatterned substrates", Nature, vol. 24, pp. 411-414, (Jul. 2003).

Krishnamoorthy et al., Block Copolymer Micelles as Switchable Templates for Nanofabrication, Languir, vol. 22, No. 8, Mar. 17, 2006, pp. 3450-3452.

Krishnamoorthy et al., Nonopatterned Self-Assembled Monolayers by Using Diblock Copolymer Micelles as nanometer-Scale Adsorption and Etch Masks, Advanced Materials, 2008, pp. 1-4.

Kuhnline et al., "Detecting thiols in a microchip device using micromolded carbon ink electrodes modified with cobalt phthalocyanine", Analyst, vol. 131, pp. 202-207, (2006).

Li, Yong, et al., "A Method for Patterning Multiple Types of Cells by Using Electrochemical Desorption of Self-Assembled Monolayers within Microfluidic Channels," Angew. Chem. Int. Ed., vol. 46, pp. 1094-1096, 2007.

Liu et al., Pattern Transfer Using Poly(styrene-block-methyl methacrylate) Copolymer Films and Reactive Ion Etching, J. Vac. Sci. Technol. B vol. 25, No. 6, Nov./Dec. 2007, pp. 1963-1968.

Loo et al., "Additive, nanoscale patterning of metal films with a stamp and a surface chemistry mediated transfer process: Applications in plastic electronics," Applied Physics Letters, vol. 81, No. 3, Jul. 15, 2002, pp. 562-564.

Lopes et al., Hierarchical Self-Assembly of Metal Nanostructures on Diblock Copolymer Scaffolds, Nature, vol. 414, Dec. 13, 2001, pp. 735-738.

Lutz, Jean-Francois, "1,3-Dipolar Cycloadditions of Azides and Alkynes: A Universal Ligation Tool in Polymer and Materials Science," Angew. Chem. Int. Ed., vol. 46, pp. 1018-1025, 2007. [Published online Jan. 9, 2007].

Malenfant et al., Self-Assembly of an Organic-Inorganic Block Copolymer for Nano-Ordered Ceramics, Nature Nanotechnology, vol. 2, pp. 43-46 (2007). [Published online Jan. 3, 2007].

Niu, Sanjun, et al., "Selective assembly of nanoparticles on block copolymer by surface modification," Nanotechnology, vol. 18, pp. 1-4, 2007. [Feb. 2007].

Park et al., Fabrication of Highly Ordered Silicon Oxide Dots and Stripes from Block Copolymer Thin Films, Advanced Materials, vol. 20, pp. 681-685, 2008.

Park et al., High-Aspect-Ratio Cylindrical Nanopore Arrays and Their Use for Templating Titania Nanoposts, Advanced Materials, vol. 20, pp. 738-742, 2008.

Park, Sang-Min, et al., "Directed assembly of lamellae-forming block copolymers using chemically and topographically patterned substrates," Advanced Materials, vol. 19, No. 4, pp. 607-611, Feb. 2007.

PCT International Search Report for Application No. PCT/US2008/060520, dated Sep. 11, 2008, 4 pages.

Reed, M.A., et al., "Molecular random access memory cell," Appl. Phys. Lett., vol. 78, No. 23, pp. 3735-3737, Jun. 2001.

Rozkiewicz, Dorota I., et al., "'Click' Chemistry by Microcontact Printing," Angew. Chem. Int. Ed., vol. 45, pp. 5292-5296, 2006. [Published online Jul. 12, 2006].

Ruiz, R., et al., "Induced Orientational Order in Symmetric Diblock Copolymer Thin-Films," Advanced Materials, vol. 19, No. 4, pp. 587-591, (2007).

(56) References Cited

OTHER PUBLICATIONS

Sato et al., Novel Antireflective Layer Using Polysilane for Deep Ultraviolet Lithography, J. Vac. Sci. Technol. B, vol. 17, No. 6, pp. 3398-3401 (1999). [Nov./Dec. 1999].

Sohn et al., Fabrication of the Multilayered Nanostructure of Alternating Polymers and Gold Nanoparticles with Thin Films of Self-Assembling Diblock Copolymers, Chem, Mater, vol. 13, pp. 1752-1757 (2001). [Published on Web Apr. 8, 2001].

Ali, H. A., et al., Porperties of Self-assembled ZnO Nanostructures, Solid-State Electronics 46 (2002), 1639-1642.

Arshady, R., et al., "The Introduction of Chloromethyl Groups into Styrene-based Polymers, 1," Makromol. Chem., vol. 177, 1976, p. 2911-2918.

Bae, Joonwon, "Surface Modification Using Photo-Crosslinkable Random Copolymers", Abstract submitted for the Mar. 2006 meeting of the American Physical Society, submitted Nov. 30, 2005. (Accessed via the Internet [retrieved on Apr. 5, 2010], URL: http://absimage.aps.org/image/MWS_MAR06-2005-003641.pdf).

Balsara, C., et al, CPIMA, IRG Technical Programs, Synthesis and application of Nanostructured Materials, Leland Stanford Junior Univ., 2006, http://www.stanford.edu/group/cpima/irg/irg_1.htm, printed Jul. 1, 2009.

Bang, J., "The Effect of Humidity on the Ordering of Tri-block Copolymer Thin Films," Abstract submitted for the Mar. 2007 meeting of the American Physical Society, submitted Nov. 20, 2006.

Bass, R. B., et al., "Microcontact Printing with Octadecanethiol", Applied Surface Science, 226(4), pp. 335-340, Apr. 2004, http://www.ece.virginia.edu/UVML/sis/Papers/rbbpapers/assoct.pdf.

Bearinger, J. P., et al., "Chemisorbed Poly(propylene sulphide)-based Copolymers Resist Biomolecular Interactions," Nature Materials 2, 259-264, 2003, (published online Mar. 23, 2003).

Berry, B.C., et al., "Effects of Zone Annealing on Thin Films of Block Copolymers", National Institute of Standard and Technology, Polymers Division, Maryland, USA, 2007.

Berry, B. C., et al., "Orientational Order in Block Copolymer Films Zone Annealed Below the Orer--Disorder Transistion Temperature," Nano Letters vol. 7, No. 9 Aug. 2007, Polymers Division, Nat'l. Inst. of Standards and Technology, Maryland, USA, pp. 2789-2794, (published on Web Aug. 11, 2007).

Black, C. T., et al., "High-Capacity, Self-Assembled Metal-Oxied-Semiconductor Decoupling Capacitors," IEEE Electron Device Letters, vol. 25, No. 9, Sep. 2004, pp. 622-624.

Black, C.T., "Integration of Self Assembly for Semiconductor Microelectronics," IEEE 2005 Custom Integrated Circuits Conference, IBM T.J. Watson Research Center, pp. 87-91.

Black, C. T., "Polymer Self-Assembly as a Novel Extension to Optical Lithography," ACSNano, vol. 1, No. 3, 2007, American Chemical Society, pp. 147-150.

Black, C.T., et al., "Self Assembly in Semiconductor Microelectronics: Self-Aligned Sub-Lithographic Patterning Using Diblock Copolymer Thin Films," Proc. of SPIE, vol. 6153, 615302 (2006).

Harrison, C., et al., "Layer by Layer Imaging of Diblock Copolymer Films with a Scanning Electron Microscope," Polymer, vol. 39, No. 13, 1998, pp. 2733-2744.

Kim, Sang Ouk, et al., "Novel Complex Nanostructure from Directed Assembly of Block Copolymers on Incommensurate Surface Patterns," Adv. Mater., 2007, 19, pp. 3271-3275.

Botelho Do Rego, A. M, et al., "Diblock Copolymer Ultrathin Films Studied by High Resolution Electron Energy Loss Spectroscopy," Surface Science, 482-485 (2001), pp. 1228-1234.

Brydson, R. M., et al. (chapter authors), "Generic Methodologies for Nanotechnology: Classification and Fabrication", Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/SUMMARY).

Bulpitt, P., et al, "New Strategy for Chemical Modification of Hyaluronic Acid: Preparation of Functionalized Derivatives and Their Use in the Formation of Novel Biocompatible Hydrogels," Journal of Biomedical Materials Research, vol. 47, Issue 2, pp. 152-169, Abstract only.

Canaria, C. A., et al., "Formation and Removal of Alkylthiolate Self-Assembled Monolayers on Gold in Aqueous Solutions", Lab Chip 6, 289-295 (2006), http://www.rsc.org/publishing/journals/LC/article.asp?doi=b51066c) (Abstract).

Candau, F., et al., "Synthesis and Characterization of Polystyrene-poly(ethylene oxide) Graft Copolymers," Polymer, 1977, vol. 18, pp. 1253-1257.

Cavicchi, K. A., et al., "Solvent Annealed Thin Films of Asymmetric Polyisoprene—Polylactide Diblock Copolymers," Macromolecules 2007, vol. 40, 2007, Univ. of Massachusetts, pp. 1181-1186.

Chandekar, A., et al., "Template-Directed Adsorption of block Copolymers on Alkanethiol-Patterned Gold Surfaces," (circa 2006), http://www.nano.neu.edu/industry/industry_showcase/industry_day/documents/Chandekar.pdf) (Powerpoint template for scientific posters (Swarthmore College)).

Chang, Li-Wen, "Diblock Copolymer Directed Self-Assembly for CMOS Device Fabrication," Proc. of SPIE, vol. 6156, 2006, 615611-1 to 615611-6.

Chang, Li-Wen, "Experimental Demonstration of Aperiodic Patterns of Directed Self-Assembly of Block Copolymer Lithography for Random Logic Circuit Layout," IEEE International Electron Devices Meeting (IEDM), paper 33.2, Dec. 6-8, San Francisco, 2010, pp. 33.2.1-33.2.4.

He, Yiyong, et al., "Self-Assembly of Block Copolymer Micelles in an Ionic Liquid," J. Am. Chem. Soc. 2006, 128, pp. 2745-2750.

Cheng, J. Y., et al., "Self-Assembled One-Dimensional Nanostructure Arrays," Nano Letters, vol. 6, No. 9, 2006, pp. 2009-2103.

Cheng, J.Y., et al., "Templated Self-Assembly of Block Copolymers: Effect of Substrate Topography," Adv. Mater., 2003, vol. 15, No. 19, pp. 1599-1602.

Cheng, J. Y., et al., "Rapid Directed Self Assembly of Lamellar Microdomains from a Block Copolymer Containing Hybrid," Applied Physics Letters, 91, 2007, pp. 143106-1 to 43106-3.

Choi, H. J., et al., "Magnetorheology of Synthesized Core—Shell Structured Nanoparticle," IEEE Transactions on Magnetics, vol. 41, No. 10, Oct. 2005, pp. 3448-3450.

Daoulas Kostas Ch., et al., "Fabrication of Complex Three-Dimensional Nanostructures from Self-Assembling Block Copolymer Materials on Two-Dimensional Chemically Patterned Templates with Mismatched Symmetry," Physical Review Letters 96, week ending Jan. 27, 2006, pp. 036104-1-3.

Darling, S. B., "Directing the Self-assembly of Block Copolymers," Progress in Polymer Science, vol. 32, No. 10, Sep. 28, 2007, pp. 1152-1204.

Desai, Dr. Trejal A., et al., "Engineered Silicon Surfaces for Bio,mimetic Interfaces," Business Briefing: Medical Device Manufacturing & Technology, 2002.

Edwards, E. W., et al., "Mechanism and Kinetics of Ordering in Diblock Copolymer Thin Films on Chemically Nanopatterned Substrates," Journal of Polymer Science: Part B Polymer Physics, vol. 43, 2005, pp. 3444-3459.

Edwards, E. W., et al., "Precise Control over Molecular Dimensions of Block-Copolymer Domains Using the Interfacial Energy of Chemically Nanopatterned Substrates," Advanced Mater., 16, No. 15, Aug. 4, 2004, pp. 1315-1319.

Elisseeff J., et al., "Photoencapsulation of Chondrocytes in Poly(ethylene oxide)-based Semi-interpenetrating Networks," Journal of Biomedical Materials Research, 51(2): 164-171, Aug. 2000, Abstract only.

Fasolka, M. J., et al., "Morphology of Ultrathin Supported Diblock Copolymer Films: Theory and Experiment," Macromolecules 2000, vol. 33, No. 15, pp. 5702-5712.

Fukunaga, K., et al., "Self-Assembly of Block Copolymer Thin Films Having a Half-Domain-Spacing Thickness: Nonequilibrium Pathways to Achieve Equilibrium Brush Layers Parallel to Substrate," Macromolecules vol. 39, Aug. 2006, pp. 6171-6179.

Gates, B. D., et al., "Unconventional Nanofabrication," Annu. Rev. Mater. Res. 2004, 34:339-72.

Ge, Zhenbin, et al., "Thermal Conductance of Hydrophilic and Hydrophobic Interfaces," PRL 96, 186101-1-186101-4, The American Physical Society, week ending May 12, 2006.

(56) References Cited

OTHER PUBLICATIONS

Gelest Inc., Silane Coupling Agents: Connecting Across Boundaries, v2.0, 2006, pp. 1-56.
Genua, A., et al., "Functional Patterns Obtained by Nanoimprinting Lithography and Subsequent Growth of Polymer Brushes," Nanotechnology, 18, (2007), IOP Publishing Ltd., UK, pp. 1-7.
Gillmor, S. D., et al., "Hydrophilic/Hydrophobic Patterned Surfaces as Templates for DNA Arrays," Langmuir 2000, vol. 16, No. 18, 2000, pp. 7223-7228.
Gudipati, C. S., et al., "Hyperbranched Fluoropolymer and Linear Poly(ethylene glycol) Based Amphiphilic Crosslinked Networks as Efficient Antifouling Coatings: An Insight into the Surface Compositions, Topographies, and Morphologies," Journal of Polymer Science Part A: Polymer Chemistry, vol. 42, 2004, pp. 6193-6208.
Guo, Kai, et al., Abstract of "Synthesis and Characterization of Novel Biodegradable Unsaturated Poly(ester amide)/Poly(ethylene glycol) Diacrylate Hydrogels", Journal of Polymer Science Part A: Polymer Chemistry, vol. 43, Issue 17, 2005 Wiley Periodicals, Inc., pp. 3932-3944.
Hamley, I. W., "Introduction to Block Copolymers", Developments in Block Copolymers Science and Technology, John Wiley & Sons, Ltd., 2004, pp. 1-29.
Hammond, M. R., et al., "Temperature Dependence of Order, Disorder, and Defects in Laterally Confined Diblock Copolymer Cylinder Monolayers, "Macromolecules, vol. 38, Jul. 2005; American Chemical Society, pp. 6575-6585.
Hawker, C. J., et al., Abstract for "Improving the Manufacturability and Structural Control of Block Copolymer Lithography," Abstracts of Papers, 232nd ACS National Meeting, San Francisco, CA, Sep. 10-14, 2006.
Hawker, C. J., et al., "Facile Synthesis of Block Copolymers for Nanolithographic Applications," Polymer Reprints, American Chemical Society, 2005.
Park, Seung Hak, et al., "Block Copolymer Multiple Patterning Integrated with Conventional ArF Lithography," Soft Matter, 2010, 6, Royal Society of chemistry, pp. 120-125.
Park, Sung Chan, et al., "Controlled Ordering of Block Copolymer Thin Films by the Addition of Hydrophilic Nanoparticles," Macromolecules 2007, vol. 40, No. 22, American Chemical Society, pp. 8119-8124.
Peng, J., et. al., "Development of Nanodomain and Fractal Morphologies in Solvent Annealed Block copolymer Thin Films," Macromol. Rapid Commun. 2007, 28, pp. 1422-1428.
Peters, R. D., et al., "Combining Advanced Lithographic Techniques and Self-assembly of Thin Films of Diblock Copolymers to Produce Templates for Nanofabrication," J. Vac. Sci. Technol. B, vol. 18, No. 6, Nov./Dec. 2000, American Vacuum Society, pp. 3530-3532.
Peters, R. D., et al., "Morphology of Thin Films of Diblock Copolymers on Surfaces Micropatterned with Regions of Different Interfacial Energy," Macromolecules, vol. 35, No. 5, 2002, American Chemical Society, pp. 1822-1834.
Potemkin, Igor I., et al., "Effect of the Molecular Weight of AB Diblock Copolymers on the Lamellar Orientation in Thin Films: Theory and Experiment," Macromol. Rapid Commun., 2007, 28, pp. 579-584.
Resnick, D. J., et al., "Initial Study of the Fabrication of Step and Flash Imprint Lithography Templates for the Printing of Contact Holes," Microlith., Microfab., Microsyst., vol. 3, No. 2, Apr. 2004, Society of Photo-Optical Instrumentation Engineers, pp. 316-321.
Rogers, J. A., "Slice and Dice, Peel and Stick: Emrging Methods for Nanostructure Fabrication," ACS Nano, vol. 1, No. 3, 2007, pp. 151-153.
Ruiz, R., et al., "Density Multiplication and Improved Lighography by Directed Block Copolymer Assembly," Science, vol. 321, Aug. 15, 2008, pp. 936-939.
Ryu, Du Yeol, et al., "Surface Modification with Cross-Linked Random Copolymers: Minimum Effective Thickness," Macromolecules, vol. 40, No. 12, 2007, American Chemical Society, pp. 4296-4300.
Saraf, Ravi R., et al., "Spontaneous Planarization of Nanoscale Phase Separated Thin Film," Applied Physics Letters, vol. 80, No. 23, Jun. 10, 2002, American Institute of Physics, pp. 4425-4427.
Sawhney, A. S., et al., "Bioerodible Hydrogels Based on Photopolymerized Poly(ethylene glycol)-co-poly(a-hydroxy acid) Diacrylate Macromers," Macromolecules 1993, 26, American Chemical Society, pp. 581-587, Abstract only.
Search Report of the IPO, Taiwanese Application No. 097110156, issued Apr. 10, 2012, two pages.
Segalman, R. A., "Patterning with Block Copolymer Thin Films," Materials Science and Engineering R 48 (2005), Elsevier B. V., pp. 191-226.
Shahrjerdi, D., et al., "Fabrication of Ni Nanocrystal Flash Memories Using a Polymeric Self-Assembly Approach," IEEE Electron Device Letters, vol. 28, No. 9, Sep. 2007, pp. 793-796.
Sharma, S. et al., "Ultrathin Poly(ethylene glycol) Films for Silicon-based Microdevices," Applied Surface Science, 206 (2003), Elsevier Science B.V., pp. 218-229.
Sivaniah, E., et al., "Observation of Perpendicular Orientation in Symmetric Diblock Copolymer Thin Films on Rough Substrates," Macromolecules 2003, 36, American Chemical Society, pp. 5894-5896.
Sivaniah, et al., "Symmetric Diblock Copolymer Thin Films on Rough Substrates, Kinetics and Structure Formation in Pure Block Copolymer Thin Films," Macromolecules 2005, 38, American Chemical Society, pp. 1837-1849.
Solak, H. H., "Nanolithography with Coherent Extreme Ultraviolet Light," Journal of Physics D: Applied Physics, 2006, IOP Publishing Ltd., UK, pp. R171-R188.
Srinvivasan, C., et al., "Scanning Electron Microscopy of Nanoscale Chemical Patterns," ACS Nano, vol. 1, No. 3, pp. 191-201, 2007.
Stoykovich, M. P., et al., "Directed Assembly of Block Copolymer Blends into Nonregular Device-Oriented Structures," Science, vol. 308, Jun. 3, 2005, pp. 1442-1446.
Stoykovich, M. P., et al., "Directed Self-Assembly of Block Copolymers for Nanolithography: Fabrication of Isolated Features and Essential Integrated Circuit Geometries," ACS Nano, vol. 1, No. 3, 2007, pp. 168-175.
Sundrani, D., et al., "Guiding Polymers to Perfection: Macroscopic Alignment of Nanoscale Domains," Nano Lett., vol. 4, No. 2, 2004, American Chemical Society, pp. 273-276.
Sundrani, D., et al., "Hierarchical Assembly and Compliance of Aligned Nanoscale Polymer Cylinders in Confinement," Langmuir 2004, vol. 20, No. 12, 2004, American Chemical Society, pp. 5091-5099.
Truskett, V. M., et. al., "Trends in Imprint Lithography for Biological Applications," TRENDS in Biotechnology, vol. 24, No. 7, Jul. 2006, pp. 312-315.
Sigma-Aldrich, 312-315 Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.
Van Poll, M. L., et al., "A Self-Assembly Approach to Chemical Micropatterning of Poly(dimethylsiloxane)," Angew. Chem. Int. Ed. 2007, 46, pp. 6634-6637.
Wang, C., et al., "One Step Fabrication and characterization of Platinum Nanopore Electrode Ensembles formed via Amphiphilic Block Copolymer Self-assembly," Electrochimica Acta 52 (2006), pp. 704-709.
Wathier, M., et al., "Dendritic Macromers as in Situ Polymerizing Biomaterials for Securing Cataract Incisions," J. Am. Chem. Soc., 2004, 126 (40), pp. 12744-12745, Abstract only.
Winesett, D.A., et al., "Tuning Substrate Surface Energies for Blends of Polystyrene and Poly(methyl methacrylate)," Langmuir 2003, 19, American Chemical Society, pp. 8526-8535.
WIPF, "Handbook of Reagents for Organic Synthesis", 2005, John Wiley & Sons Ltd., p. 320.
Xiao, Shuaigang., et al., "Graphoepitaxy of Cylinder-forming Block Copolymers for Use as Templates to Pattern Magnetic Metal Dot Arrays," Nanotechnology 16, IPO Publishing Ltd, UK (2005), pp. S324-S329.

(56) References Cited

OTHER PUBLICATIONS

Xu, Ting, et al., "The Influence of Molecular Weight on Nanoporous Polymer Films," Polymer 42, Elsevier Science Ltd., (2001) pp. 9091-9095.

Wu, C.Y., et al., "Self-Assembled Two-Dimensional Block Copolymers on Pre-patterned Templates with Laser Interference Lithography," IEEE, 2007, pp. 153-154.

Yamaguchi, Toru, et al., "Two-dimensional Arrangement of Vertically Oriented Cylindrical Domains of Diblock Copolymers Using Graphoepitaxy with Artificial Guiding Pattern Layout," Microprocesses and Nanotechnology, 2007, Conference date Nov. 5-8, 2007, pp. 434-435.

Yan, Xiaohu, et al., "Preparation and Phase Segregation of Block Copolymer Nanotube Multiblocks," J. Am. Chem. Soc., vol. 126, No. 32, 2004, American Chemical Society, pp. 10059-10066.

Yang, Xiao M., et al., "Guided Self-Assembly of Symmetric Diblock Copolymer Films on Chemically Nanopatterned Substrates," Macromolecules 2000, vol. 33, No. 26, 2000, American Chemical Society, pp. 9575-9582.

Yang, Xiaomin, et al., "Nanoscopic Templates Using Self-assembled Cylindrical Diblock Copolymers for Patterned Media," J. Vac. Sci. Technol. B 22(6), Nov./Dec. 2004, American Vacuum Society, pp. 3331-3334.

Yurt, Serkan, et al., "Scission of Diblock Copolymers into Their Constituent Blocks," Macromolecules 2006, vol. 39, No. 5, 2006, American Chemical Society, pp. 1670-1672.

Zhang, Mingfu, et al., "Highly Ordered Nanoporous Thin Films from Cleavable Polystyrene-block-poly(ethylene oxide),"Adv. Mater. 2007, 19, pp. 1571-1576.

Zhang, Yuan, et al., "Phase Change Nanodot Arrays Fabricated Using a Self-Assembly Diblock Copolymer Approach," Applied Physics Letter, 91, 013104, 2007, American Institute of Physics, pp. 013104 to 013104-3.

Helmbold, A., et al., "Optical Absorption of Amorphous Hydrogenated Carbon Thin Films," Thin Solid Films 283 (1996) pp. 196-203.

Hermans, T. M., et al., "Application of Solvent-Directed Assembly of Block Copolymers to the Synthesis of Nanostructured Materials with Low Dielectric Constants", Angewandte Chem. Int. Ed., vol. 45, Issue 40, Oct. 13, 2006, pp. 6648-6652.

Hutchison, J. B, et al., "Polymerizable Living Free Radical Initiators as a Platform to Synthesize Functional Networks," Chem. Mater., vol. 17, No. 19, 2005, pp. 4789-4797.

Ikeda, Susumu, et al., "Control of Orientation of Thin Films of Organic Semiconductors by Graphoepitaxy," NanotechJapan Bulletin—vol. 3, No. 3, Dec. 17, 2010/Focus 26-06, NIMS International Center for Nanotechnology Network.

In, Insik, et al., "Side-Chain-Grafted Random Copolymer Brushes as Neutral Surfaces for Controlling the Orientation of Block Copolymer Microdomains in Thin Films," Langmuir, vol. 22, No. 18, 2006, Department of Materials Science and Engineering and Chemical and Biological Engineering, Univ. of Wisconsin-Madison, pp. 7855-7860.

Ji, Shengxiang, et al., "Preparation of Neutral Wetting Brushes for Block Copolymer Films from Homopolymer Blends," submitted to Advanced Materials, 20(16): 3054-3060; published online Jul. 7, 2008.

Ji, Shengxiang, et al., "Generalization of the Use of Random Copolymers to Control the Wetting Behaviors of Block Copolymer Films," Macromolecules, 2008, 41(23): 9098-9103.

Ji, Shengxiang, et al., "Molecular Transfer Printing Using Block Copolymers," ACS Nano, vol. 4, No. 2, 2010, Dept. of Chemical and Biological Engineering, Univ. of Wisconsin, pp. 599-609.

Jun, Y., et al., "Microcontact Printing Directly on the Silicon Surface," Langmuir, 2002, 18(9), pp. 3415-3417, Abstract only.

Karim, Alamgir, et al., "Control of Ordering Kinetics and Morphology Using Zone Annealing of Thin Block Copolymer Films", Abstract submitted for the Mar. 2007 Meeting of the American Physical Society, Nov. 20, 2006.

Kim, IS, et al., "Self-assembled Hydrogel Nanoparticles Composed of Dextran and Poly (ethylene glycol) Macromer," Int J Pharm., Sep. 15, 2000; 205(1-2): 109-16, Abstract only.

Kim, Sang Ouk, et al., "Epitaxial Self-assembly of Block Copolymers on Lithographically Defined Nanopatterned Substrates," Nature, vol. 424, Jul. 24, 2003, Dept. of Chemical Engineering and Center for Nanotechnology, and Dept. of Mechanical Engineering, Univ. of Wisconsin, pp. 411-414.

Kim, Seung Hyun, et al., "Highly Oriented and Ordered Arrays from Block Copolymers via Solvent Evaporation," Adv. Mater. 2004, 16, No. 3, Feb. 3, pp. 226-231.

Kim, Seung Hyun, et al., "Salt Complexation in Block Copolymer Thin Films," Macromolecules 2006, vol. 39, No. 24, 2006, pp. 8473-8479.

Kim, Seung Hyun, et al., "Solvent-Induced Ordering in Thin Film Diblock Copolymer/Homopolymer Mixtures," Advanced Mater., vol. 16, No. 23-24, Dec. 17, 2004, pp. 2119-2123.

Kim, SH, et al., "In Vitro Release Behavior of Dextran-methacrylate Hydrogels Using Doxorubicin and Other Model Compounds," J Biomater Appl., Jul. 2000; 15(1): 23-46 Abstract only.

Kim, Sh, et al., "Synthesis and characterization of Dextran-methacrylate Hydrogels and Structural Study by SEM," J Biomater Res., Mar. 15, 2000; 49(4): 517-27 Abstract only.

Kim, Su-Jin, et al., "Hybrid Nanofabrication Processes Utilizing Diblock Copolymer Nanotemplate Prepared by Self-assembled Monolayer Based Surface Neutralization," J. Vac. Sci. Technol. B26(1), Jan./Feb. 2008, American Vacuum Society, pp. 189-194.

Knoll, A., et al., "Phase Behavior in Thin Films of Cylinder-Forming Block Copolymers," Physical Review Letters vol. 89, No. 3 Jul. 2002, The American Physical Society, pp. 035501-1 to 035501-4.

Krishnamoorthy, S., et al., "Nanoscale Patterning with Block Copolymers," MaterialsToday, vol. 9, No. 9, Sep. 2006, pp. 40-47.

La, Young-Hye, et al., "Directed Assembly of Cylinder-Forming Block Copolymers into Patterned Structures to Fabricate Arrays of Spherical Domains and Nanoparticles," Chem. Mater, 2007, vol. 19, No. 18, Department of Chemical and Biological Engineering and Center for Nanotechnology, Univ. of Wisconsin, pp. 4538-4544.

La, Young-Hye, et al., "Pixelated Chemically Amplified Resists: Investigation of Material Structure on the Spatial Distribution of Photoacids and Line Edge Roughness," J. Vac. Sci. Technol. B 25(6), Nov./Dec. 2007, American Vacuum Society, pp. 2508-2513.

Laracuente, A.R., et al., "Step Structure and Surface Morphology of Hydrogen-terminated Silicon: (001) to (114)," Surface Science 545, 2003, pp. 70-84.

Li, Mingqi, et al., "Block Copolymer Patterns and Templates," Materials Today, vol. 9, No. 9, Sep. 2006, pp. 30-39.

Li, Wai-Kin, et al, "Creation of Sub-20-nm Contact Using Diblock Copolymer on a 300 mm Wafer for Complementary Metal Oxide Semiconductor Applications," J. Vac. Sci. Technol. B 25(6), Nov./Dec. 2007, American Vacuum Society, pp. 1982-1984.

Li, Xue, et al., "Morphology Change of Asymmetric Diblock Copolymer Micellar Films During Solvent Annealing," ScienceDirect, Polymer 48 (2007), pp. 2434-2443.

Lin, Zhiqun, et al., "A Rapid Route to Arrays of Nanostructures in Thin Films," Adv. Mater. 2002, 14 No. 19, Oct. 2, pp. 1373-1376.

Lin-Gibson, Sheng, et al., "Structure--Property Relationships of Photopolymerizable Poly(ethylene glycol) Dimethacrylate Hydrogels," Macromolecules 2005, 38, American Chemical Society, pp. 2897-2902.

Lutolf, M., et al., "Cell-Responsive Synthetic Hydrogels," Adv. Mater., vol. 15, No. 11, Jun. 2003, pp. 888-892.

Malkoch, M., et al., "Synthesis of Well-defined Hydrogel Networks Using Click Chemistry," Chem. Commun., 2006, The Royal Society of Chemistry, pp. 2774-2776.

Mansky, P., et al., "Controlling Polymer-Surface Interactions with Random Copolymer Brushes," Science, vol. 275, Mar. 7, 1997, pp. 1458-1460.

Martens, P., et al., "Characterization of Hydrogels Formed from Acrylate Modified Poly(vinyl alcohol) Macromers," Polymer, vol. 41, Issue 21, Oct. 2000, pp. 7715-7722, Abstract only.

Matsuda, T., et al., "Photoinduced Prevention of Tissue Adhesion," ASAIO J, Jul.-Sep. 1992; 38(3): M154-7, Abstract only.

(56) References Cited

OTHER PUBLICATIONS

Maye, M. A., et al., "Chemical Analysis Using Force Microscopy," Journal of Chemical Education, vol. 79, No. 2, Feb. 2002, Dept. of Chemistry, State Univ. Of New York at Binghamton, USA, pp. 207-210.

Metters, A., et al., "Network Formation and Degradation Behavior of Hydrogels Formed by Michael-Type Addition Reactions," Biomacromolecules 2005, 6, 2005, pp. 290-301.

Meyer, E., et al., "Controlled Dewetting Processes on Microstructured Surfaces--a New Procedure for Thin Film Microstructuring," Macromollecular Mater. Eng., 276/277, 2000, Institute of Polymer Research Dresden, pp. 44-50.

Mezzenga, R., et al., "On the Role of Block Copolymers in Self-Assembly of Dense Colloidal Polymeric Systems," Langmuir 2003, vol. 19, No. 20, 2003, American Chemical Society, pp. 8144-8147.

Mindel, J., et.al., "A Study of Bredig Platinum Sols", The Chemical Laboratories of New York University, vol. 65 pp. 2112.

Nealey, P. F., et al., "Self-Assembling Resists for Nanolithography", IEEE 2005.

Naito, K., et al., "2.5-Inch Disk Patterned Media Prepared by an Artificially Assisted Self-Assembling Method," IEEE Transactions on Magnetics, vol. 38, No. 5, Sep. 2002, pp. 1949-1951.

Nguyen, K. T., et al., "Photopolymerizable Hydrogels for Tissue Engineering Applicaitons," Biomaterials 23, 2002, pp. 4307-4314.

Nishikubo, T., "Chemical Modification of Polymers via a Phase-Transfer Catalyst or Organic Strong Base," American Chemical Society Symposium Series, 1997, American Chemical Society, pp. 214-230.

Niu, Sanjun, et al., "Stability of Order in Solvent-Annealed Block Copolymer Thin Films," Macromolecules, vol. 36, No. 7, 2003, Univ. Of Nebraska, USA, pp. 2428-2440, (web release date: Mar. 13, 2003) (http://digitalcommons.uni.edu/cgi/viewcontent.cgi?article+1005&contect=chemeng_nanotechnology).

Olayo-Valles, R., et al., "Large Area Nanolithographic Templates by Selective Etching of Chemically Stained Block Copolymer Thin Films," J. Mater. Chem, 2004, 14, the Royal Society of Chemistry, pp. 2729-2731.

Parejo, P. G., et al., "Highly Efficient UV-absorbing Thin-film Coatings for Protection of Organic Materials Against Photodegradation," J. Mater. Chem., 2006, 16, The Royal Society of Chemistry, pp. 2165-2169.

Park, Cheolmin, et al., "Enabling Nanotechnology with Self Assembled Block Copolymer Patterns," Polymer 44, 2003, pp. 6725-6760.

Park, Dae-Ho, "The Fabrication of Thin Films with Nanopores and Nanogrooves from Block Copolymer Thin Films on the Neutral Surface of Self-assembled Monolayers," Nanotechnology 18, 2007, 355304, IIOP Publishing LTD, UK, pp. 1-7.

Park, M., et al., "Block Copolymer Lithography: Periodic Arrays of 10[to the 11th] Holes in 1 Square Centimeter," Science, vol. 276, No. 5317, May 30, 1997, pp. 1401-1404.

Fujita et al., Thin Silica Film with a Network Structure as Prepared by Surface Sol-Gel Transcription on the Poly (styrene-b-4-vinylpyridine) Polymer Film, Chemistry Letters, vol. 32, No. 4, Dec. 31, 2003, pp. 352-353.

Melde et al., Silica Nanostructures Templated by Oriented Block Copolymer Thin Films Using Pore-Filling and Selective-Mineralization Routes, Chem. Mater., vol. 17, No. 18, Aug. 13, 2005, pp. 4743-4749.

Lentz, D, et al., "Whole Wafer Imprint Patterning Using Step and Flash Imprint Lithography: A Manufacturing Solution for Sub 100 nm Patterning", SPIE Advanced Lithography Paper, http://molecularimprints.com/NewsEvents/tech_articles/new_articles/SPIE_07_MII_WW_Paper.pdf), Molecular Imprints, Inc., Texas, USA, Feb. 2007, pp. 1-107.

Lutolf, M.P., et al, "Synthetic Biomaterials as Instructive Extracellular Microenvironments for Morphogenesis in Tissue Engineering," Nature Biotechnology, 23, 47-55 (2005), Abstract only.

Sang et al., "Epitaxial self-assembly of block copolymers on lithographically defined nanopatterned substrates", Nature, vol. 24, pp. 411-414, (Jul. 2003).

Tang et al., Evolution of Block Copolymer Lithography to Highly Ordered Square Arrays, Science, vol. 322, No. 5900, Sep. 25, 2008, pp. 429-432.

Tseng et al., Enhanced Block Copolymer Lithography Using Sequential Infiltration Synthesis, The Journal of Physical Chemistry, vol. 115, No. 36, Sep. 15, 2011, 15 pages.

* cited by examiner

SEMICONDUCTOR STRUCTURES INCLUDING POLYMER MATERIAL PERMEATED WITH METAL OXIDE

CROSS-REFERENCE TO RELATED APPLICATIONS

This application is a divisional of U.S. patent application Ser. No. 12/259,921, filed Oct. 28, 2008, now U.S. Pat. No. 8,097,175, issued Jan. 17, 2012, for METHOD FOR SELECTIVELY PERMEATING A SELF-ASSEMBLED BLOCK COPOLYMER, METHOD FOR FORMING METAL OXIDE STRUCTURES, METHOD FOR FORMING A METAL OXIDE PATTERN, AND METHOD FOR PATTERNING A SEMICONDUCTOR STRUCTURE. This application is also related to U.S. patent application Ser. No. 11/766,663, filed Jun. 21, 2007, now U.S. Pat. No. 8,294,139, issued Oct. 23, 2012, for MULTILAYER ANTIREFLECTION COATINGS, STRUCTURES AND DEVICES INCLUDING THE SAME AND METHODS OF MAKING THE SAME. This application is also related to U.S. patent application Ser. No. 11/787,928, filed Apr. 18, 2007, now U.S. Pat. No. 7,959,975, issued Jun. 14, 2011, for METHODS OF PATTERNING A SUBSTRATE. The disclosure of each of the foregoing documents is incorporated herein in its entirety by reference. This patent is also related to U.S. patent application Ser. No. 13/157,838, filed Jun. 10, 2011, pending, and U.S. patent application Ser. No. 13/613,358, filed Sep. 13, 2012, now U.S. Pat. No. 8,551,808, issued Oct. 8, 2013.

TECHNICAL FIELD

The invention, in various embodiments, relates generally to methods for selectively permeating self-assembled block copolymers with metal oxides to form metal oxide structures, to methods of forming semiconductor structures using such metal oxide structures, and to semiconductor structures including the metal oxide structures.

BACKGROUND

The economics (i.e., cost per die) of electronic components improves significantly as feature size becomes smaller. As the size of device features becomes ever smaller, conventional lithographic processes become increasingly more difficult and expensive to use. Therefore, significant challenges are encountered in the fabrication of nanostructures, particularly structures having a feature size of less than 50 nm.

It is possible to fabricate isolated or semi-dense structures at this scale using a conventional lithographic process such as, for example, nanoimprint lithography, laser interferometry, extreme ultraviolet interference lithography, shadow mask lithography, e-beam lithography, or scanning-probe-microscopy-based lithography. However, such techniques are limited because the exposure tools are extremely expensive or extremely slow and, further, may not be amenable to formation of structures having dimensions of less than 50 nm.

The development of new processes and materials is of increasing importance in making fabrication of small-scale devices easier, less expensive, and more versatile. One example of a method of patterning that addresses some of the drawbacks of conventional lithographic techniques is block copolymer lithography, where use is made of polymer masks derived from self-assembly of block copolymers. Block copolymers are known to form nano-scale microdomains by microphase separation. When cast on a substrate and annealed, block copolymers form nano-scale periodic patterns that may be useful as an etch mask in semiconductor device fabrication. Such ordered patterns of isolated nano-sized structural units formed by the self-assembled block copolymers may potentially be used for fabricating periodic nano-scale structural units and, therefore, have promising applications in semiconductor, optical, and magnetic devices. Dimensions of the structural units so formed are typically in the range of 5 nm to 50 nm, which dimensions are extremely difficult to define using conventional lithographic techniques. The size and shape of these domains may be controlled by manipulating the molecular weight and composition of the copolymer. Additionally, the interfaces between these domains have widths on the order of 1 nm to 5 nm and may be controlled by changing the chemical composition of the blocks of the copolymers. However, the domains of the self-assembling block copolymers often have little or no etch selectivity for one another. Therefore, improving etch selectivity of the self-assembled domains is desirable.

Buriak and Chai, "Assembly of Aligned Linear Metallic Patterns on Silicon," *Nature Nanotechnology,* 2, 500-506 (August 2007), discloses forming aligned metal lines by metal loading self-assembled monolayers of aligned, horizontal block copolymer cylinders using an aqueous solution of an anionic metal complex.

Cha et al., "Biometric Approaches for Fabricating High-Density Nanopatterned Arrays," *Chem. Mater.,* 19, 839-843 (2007) discloses using the self-assembling properties of AB diblock copolymers to make polymer thin films as nanometer etch masks. A more etch-resistant film is formed by enriching the domains within the block polymer thin films with metals such as silicon.

Chai and Buriak, "Using Cylindrical Domains of Block Copolymers to Self-Assemble and Align Metallic Nanowires," *ACS Nano,* 2 (3), 489-501 (2008), discloses metal ion loading of self-aligned polystyrene-poly(2-vinylpyridine) block copolymers on silicon surfaces using aqueous solutions of anionic metal complexes. The basic poly(2-vinylpyridine) is protonated, rendering it cationic so that electrostatic attraction leads to a high local concentration of metal complexes within the poly(2-vinylpyridine) domain. A plasma etching process is performed to remove the polymer and form metallic nanowires.

To achieve higher-density circuits, storage devices, or displays, there is a need for less expensive fabrication techniques which are suitable for fabricating complex devices with the required enhanced density and reliable addressability of elements to meet future demands.

DETAILED DESCRIPTION

Figure 1:
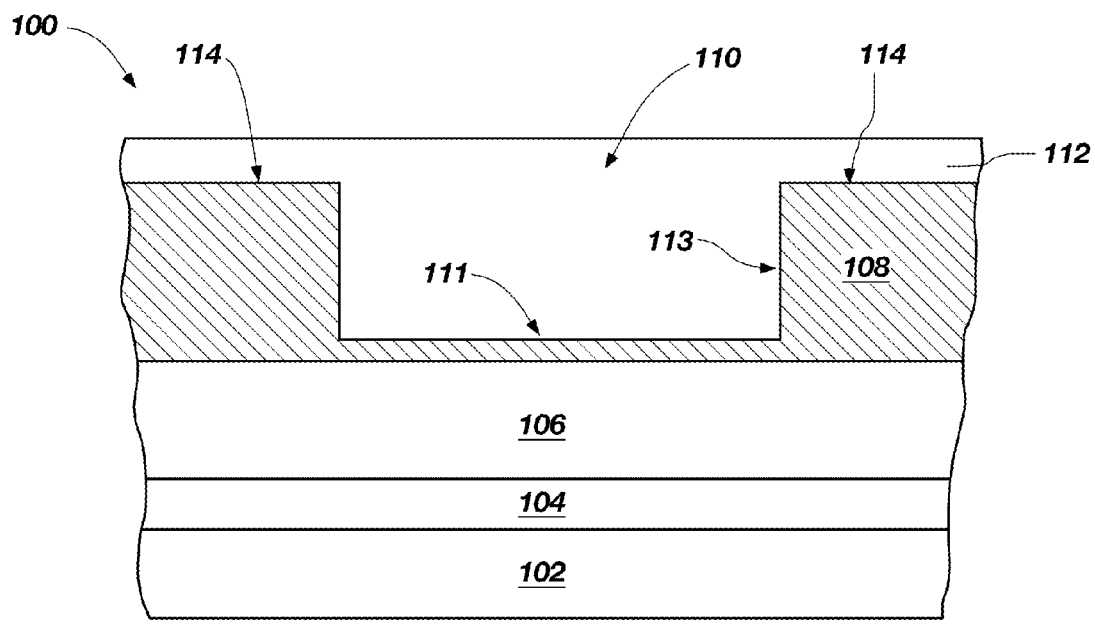
FIG. 1 is a partial cross-sectional view illustrating an embodiment of a method that may be used to fabricate metal oxide structures on a semiconductor structure.

As discussed in further detail below, in some embodiments, the present invention comprises methods of selective permeation or impregnation of metal oxides into a self-assembled block copolymer and methods of forming metal oxide structures utilizing the controlled formation of block copolymers. In other embodiments, the present invention includes a semiconductor structure including a pattern of such metal oxide structures.

As used herein, the term "substrate" means and includes a base material or construction upon which materials are formed. The substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the term "block copolymer" means and includes polymers that include one or more long sequences (i.e., "blocks") of the same monomeric unit(s) covalently bound to one or more long sequences (i.e., "blocks") of unlike type, for example, including differing monomeric unit(s). A wide variety of block copolymers are contemplated herein including diblock copolymers (copolymers having two blocks), triblock copolymers (copolymers having three blocks), multiblock copolymers (copolymers having more than three blocks), and combinations thereof.

The term "phase separation," as used herein means and includes the properties by which homogenous polymers or homogenous segments of a block copolymer aggregate mutually, and heterogeneous polymers or heterogeneous segments separate into distinct domains.

The term "annealing" or "anneal" as used herein means and includes treatment of the block copolymer so as to enable sufficient phase separation between the two or more different polymeric block components of the block copolymer to faun an ordered pattern defined by repeating structural units. Annealing of the block copolymer in the present invention may be achieved by various methods known in the art, including, but not limited to: thermal annealing (either in a vacuum or in an inert atmosphere containing nitrogen or argon), solvent vapor-assisted annealing (either at or above room temperature), or supercritical fluid-assisted annealing. As a specific example, thermal annealing of the block copolymer may be conducted by exposing the block copolymer to an elevated temperature that is above the glass transition temperature ($T_g$), but below the degradation temperature ($T_d$) of the block copolymer, as described in greater detail hereinafter. Other conventional annealing methods not described herein may also be utilized.

The term "preferential wetting," as used herein, means and includes wetting of a block copolymer wherein one block of the block copolymer will wet a contacting surface at an interface more easily than the other block(s).

The following description provides specific details, such as material types, material thicknesses, and processing conditions in order to provide a thorough description of embodiments of the invention. However, a person of ordinary skill in the art will understand that the embodiments of the invention may be practiced without employing these specific details. Indeed, the embodiments of the invention may be practiced in conjunction with conventional semiconductor fabrication techniques employed in the industry. In addition, the description provided below does not form a complete process flow for manufacturing a semiconductor device in which the metal oxide structure is present, and the semiconductor devices described below do not form a complete electronic device. Only those process acts and metal oxide structures or semiconductor devices necessary to understand the embodiments of the invention are described in detail below. Additional processing acts to form a complete semiconductor device from the metal oxide structures or to form a complete electronic device from the semiconductor device may be performed by conventional fabrication techniques, which are not described herein.

The materials described herein may be formed by any suitable technique including, but not limited to, spin coating, blanket coating, chemical vapor deposition ("CVD"), atomic layer deposition ("ALD"), plasma enhanced ALD, or physical vapor deposition ("PVD"). Alternatively, the materials may be grown in situ. Depending on the specific material to be formed, the technique for depositing or growing the material may be selected by a person of ordinary skill in the art. While the materials described and illustrated herein may be formed as layers, the materials are not limited thereto and may be formed in other three-dimensional configurations.

Reference will now be made to the figures, wherein like numerals represent like elements. The figures are not necessarily drawn to scale.

FIG. 1 is a partial cross-sectional schematic view of an embodiment of a semiconductor structure 100 of the present invention. The semiconductor structure 100 may be provided, which, includes a substrate 102, a dielectric material 104, a semiconductive material 106, and an insulative material 108. The substrate 102, as previously discussed, may comprise a full or partial wafer of semiconductor material or a material such as glass or sapphire. The dielectric material 104 may be provided over and in contact with a surface of the substrate 102. By way of example and not limitation, the dielectric material 104 may include silicon oxynitride (SiON), silicon nitride ($Si_3N_4$), silicon dioxide ($SiO_2$), another oxide material, or a polymer material, and may be formed using, for example, CVD, PVD, or ALD. The semiconductive material 106 may include, for example, a doped polysilicon material and may be formed over and in contact with the dielectric material 104 using conventional techniques, which are not described in detail herein. The insulative material 108 may include an oxide such as silicon dioxide ($SiO_2$), and may be formed by CVD, by decomposing tetraethylorthosilicate (TEOS), or by any other process known in the art of integrated circuit fabrication.

Referring still to FIG. 1, the semiconductor structure 100 may have a trench 110 formed therein, the trench 110 filled with a block copolymer material 112. The trench 110 may be defined by a lower surface 111 and sidewalls 113 of the insulative material 108. For the sake of clarity, the semiconductor structure 100 depicted in the following drawings includes one trench 110 formed partially through a thickness of the insulative material 108. In other embodiments, a plurality of trenches 110 may be formed in the semiconductor structure 100. The trenches 110 may be formed through a thickness of any of the underlying materials such as the semiconductive material 106, the dielectric material 104, and the substrate 102. The trench 110 may have a depth sufficient to form a monolayer of the block copolymer material 112, which is described in further detail below. For example, the trench 110 may have a depth in a range of from about 15 nm to about 50 nm, and may be formed using, for example, patterning techniques (e.g., masking and etching) known in the art of integrated circuit fabrication. Additionally, in some embodiments, another dielectric material (not shown), such as silicon dioxide, may be formed over the sidewalls 113 and the lower surface 111 of the trenches 110 using a process such as atomic layer deposition (ALD). As a non-limiting example, the another dielectric material may be a thin, conformal film of a material that preferential wets a minority domain of the block copolymer material 112, as will be described in further detail herein.

Referring still to FIG. 1, the block copolymer material 112 may be provided over the semiconductor structure 100 (i.e., an exposed surface of the insulative material 108 and within the trench 110). By way of example and not limitation, the block copolymer material 112 may be deposited over the semiconductor structure 100 to a thickness sufficient to fill the trench 110 and to overlie surfaces 114 of the insulative material 108. As a non-limiting example, the block polymer material 112 overlying the surfaces 114 of the insulative material 108 may be applied to have a thickness of less than or equal to a monolayer of the block copolymer material 112. The block copolymer material 112 may be applied by any suitable technique such as, for example, spin casting, spin coating, spraying, ink coating, or dip coating.

The block copolymer material 112 may include at least two copolymer blocks that are substantially immiscible in one another. By way of non-limiting example, the block copolymer material 112 may be a diblock copolymer that includes a hydrophilic block and a hydrophobic block, which may be capable of undergoing phase separation, which is described in further detail below. The block copolymer material 112 may include the hydrophilic block and the hydrophobic block at a ratio in a range of from about 80:20 by weight to about 50:50 by weight and, more specifically, at a ratio of about 70:30 by weight.

The hydrophilic block may include a polymer formulated for swelling or wetting upon contact with a solvent, such as an alcohol. By way of non-limiting example, the hydrophilic block polymer may include polyvinylpyridine (PVP), hydroxypropyl methylcellulose (HPMC), polyethylene glycol (PEG), poly(ethylene oxide)-co-poly(propylene oxide) di- or multiblock copolymers, poly(ethylene oxide) (PEO), poly(vinyl alcohol) (PVA), poly(ethylene-co-vinyl alcohol), poly(acrylic acid), poly(ethyloxazoline), a poly(alkylacrylate), poly(acrylamide), a poly(N-alkylacrylamide), a poly(N,N-dialkylacrylamide), poly(propylene glycol) (PPG), poly(propylene oxide), partially or fully hydrolyzed poly(vinyl alcohol), dextran, and copolymers and combinations thereof.

The hydrophobic block may include a polymer insoluble in the solvent, such as an alcohol, which results in swelling or wetting the hydrophobic block upon contact. As a non-limiting example, the hydrophobic block may include polystyrene (PS), polyethylene (PE), polypropylene (PP), polychloroprene (CR), a polyvinyl ether, poly(vinyl acetate) (PVA$_c$), poly(vinyl chloride) (PVC), a polysiloxane, a polyurethane (PU), a polyacrylate, a polyacrylamide, and copolymers and mixtures thereof.

By way of non-limiting example, block copolymer materials 112 that may be used for forming the self-assembled copolymer may include polystyrene-block-polyvinylpyridine (PS-b-PVP), polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA). As described above, the block copolymer may be a diblock copolymer. However, block copolymers having three (a triblock copolymer) or more (a multiblock copolymer) blocks may also be used. One example of a triblock copolymer includes, but is not limited to, poly(styrene-block methyl methacrylate-block-ethylene oxide). Multiblock copolymers may have three or more blocks selected from the following: polystyrene, polymethylmethacrylate, polyethyleneoxide, polyisoprene, polybutadiene, poly lactic acid, polyvinylpyridine, and combinations thereof.

Figure 2:
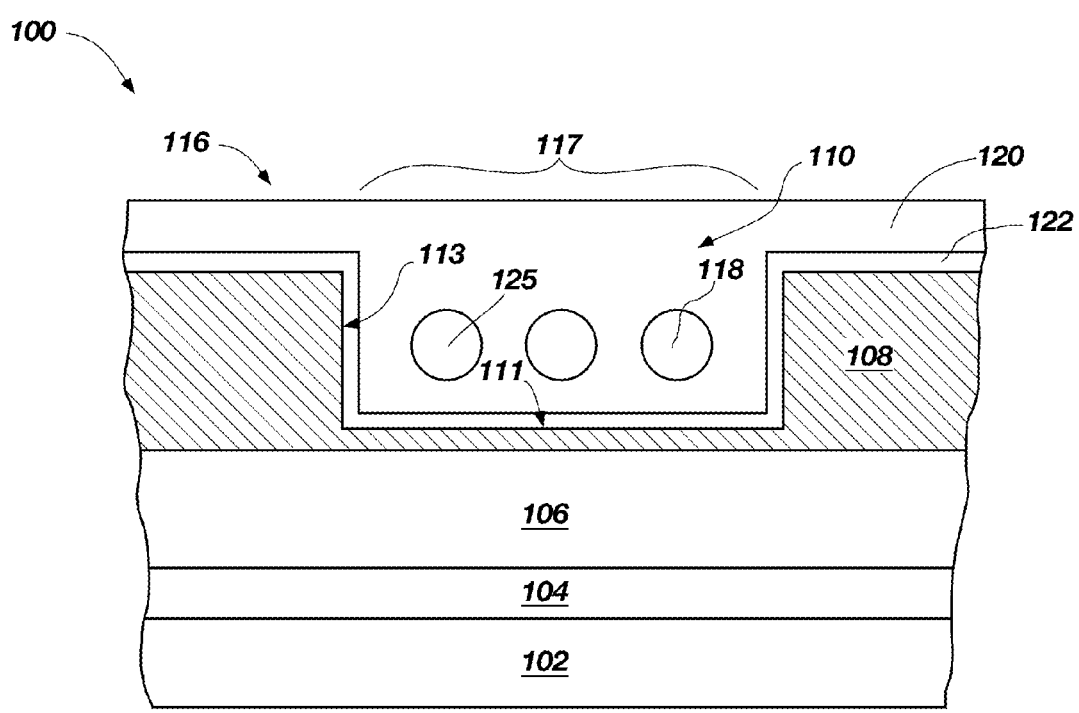
FIG. 2 is a partial cross-sectional view illustrating an embodiment of a method that may be used to fabricate metal oxide structures on a semiconductor structure.

Referring to FIG. 2, an annealing process may be used to initiate phase separation between the copolymer blocks of the block copolymer material 112. The block copolymer material 112 may be annealed using, for example, thermal annealing, solvent vapor-assisted annealing, supercritical fluid-assisted annealing, or a combination thereof, which is described in further detail below. During annealing, the block copolymer material 112 may undergo phase separation wherein the sidewalls 113 of the trench 110 guide self-assembly, or self-registration, of the copolymer blocks of the block copolymer material 112, which is often referred to as "graphoepitaxy," so as to form a plurality of ordered domains 118 including at least one copolymer block within a matrix 120 of at least one different copolymer block. The ordered domains 118 may include repeating structural units having a regular or defined order. Specifically, the lower surface 111 and the sidewalls 113 of the trench 110 may be most preferentially wetted by at least the minority block of the at least two copolymer blocks of the block copolymer material 112. The preferential wetting of the minority copolymer block with both the lower surface 111 and sidewalls 113 of the trench 110 results in the formation of the ordered domains 118 within the trench 110.

Each of the domains 118 includes self-aggregated minority block portions of polymer chains held together by a non-covalent bond and is aligned parallel to an axis of the trench 110. By way of non-limiting example, phase separation of the block copolymer material 112 may result in the formation of a self-assembled film 116 including an ordered array 117 of domains 118 surrounded by the matrix 120. For example, where the block copolymer material 112 includes the hydrophilic block and the hydrophobic block, the domains 118 may include the hydrophilic block, and the matrix 120 may include the hydrophobic block. The number of domains 118 may be determined by the width of the trench 110 together with the inherent periodicity (Lo). Based on the periodicity (Lo) of the copolymer, the width of the trench 110 may be controlled to form a number (n) of trenches determined width/periodicity, which may be for example, sufficient to form a number of domains 118 in a range of from about one to about fifty (50). Additionally, an interface material 122 including the hydrophilic block may form at an interface between the matrix 120 and the underlying material of the insulative material 108.

For the sake of clarity, the domains 118 are shown in FIG. 2 as cylinders having an axis 125 parallel to the substrate 102 and horizontally aligned with sidewalls 113 of the trench 110 (i.e., parallel to a surface 111 of the trench 110). By way of non-limiting example, the domains 118 may be cylinders having a diameter in a range of from about 5 nm to about 50 nm. The length of the domains 118 may be substantially equal to the length of the trench 110. The morphology of the self-assembled film 116, including the size and shape of the domains 118, may be controlled by the molecular weight and volume fraction of the copolymer blocks of the block copolymer to produce lamellar, cylindrical or spherical morphologies, among others. By way of non-limiting example, when the block copolymer material 112 includes polyvinylpyridine and polystyrene at a ratio of between about 80:20 and 60:40, lamellar domains or alternating cylinders, often referred to as "stripes" of the polyvinylpyridine may be formed. In other embodiments, the domains 118 may be spherical units, hexagonal units, or any other shape that may be formed by the phase separation of the block copolymer material 112.

In some embodiments, the block copolymer material 112 may be heated to a temperature at or above a glass transition temperature and below a decomposition temperature of the copolymer blocks either in a vacuum or in an inert atmosphere, to cause the block copolymer material 112 to phase separate and form the self-assembled film 116. The inert atmosphere may include, by way of non-limiting example, nitrogen or argon. For example, the block copolymer material 112 may be heated to a temperature in a range of from about 130° C. to about 275° C.

In additional embodiments, the block copolymer material 112 may be exposed to a solvent vapor to cause phase separation and the formation of ordered domains 118. The solvent vapor may be formed by converting a solvent capable of initiating phase separation to the gas phase. By way of non-limiting example, the solvent vapor may be formed from toluene, tetrahydrofuran, dimethylformamide, and combinations thereof. For example, the block copolymer material 112 may be annealed exposing the block copolymer material 112 to toluene vapor at a temperature of greater than or equal to about 24° C.

By way of non-limiting example, when the copolymer block material 112 is polystyrene-block-polyvinylpyridine, the polyvinylpyridine may preferentially wet the lower surface 111 and sidewalls 113 of the trench 110 during the annealing process, while the polystyrene may preferentially wet the air interface, resulting in the formation of the interface material 122 of polyvinylpyridine as well as repeating cylindrical domains 118 including polyvinylpyridine, each having an axis 125 parallel to an axis of the trench 110 and disposed within the matrix 120 including polystyrene.

Figure 3:
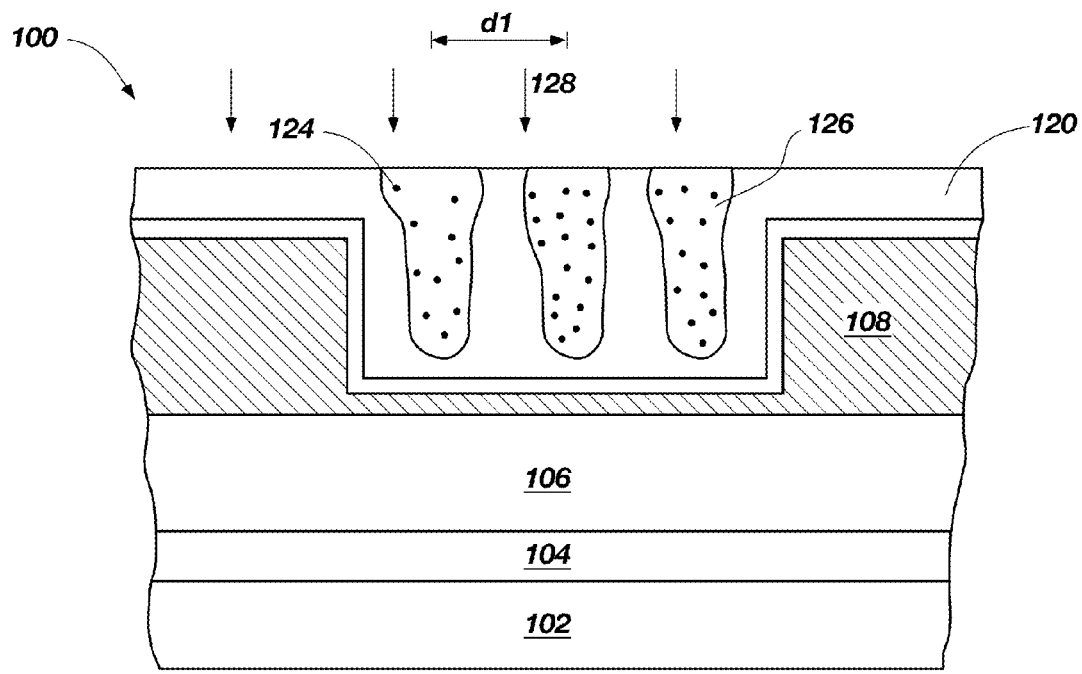
FIG. 3 is a partial cross-sectional view illustrating an embodiment of a method that may be used to fabricate metal oxide structures on a semiconductor structure.

Referring to FIG. 3, the self-assembled film 116 shown in FIG. 2 may be exposed to a swelling agent, which may permeate at least a portion of the ordered domains 118 (FIG. 2) resulting in the formation of swollen domains 126. The swelling agent may cause a region of the swollen domains 126 to swell or rupture as shown in FIG. 3, while remaining regions of the swollen domains 126 may maintain a shape substantially identical to or similar to a shape of the ordered domains 118 (FIG. 2). The swelling agent may laterally permeate the remaining regions of the swollen domains 128 via the intermittent regions that have swollen or ruptured. In some embodiments, the swelling agent may include a metal oxide precursor and may be introduced to form swollen domains impregnated with the metal oxide precursor 124. The swelling agent may be applied to the self-assembled film 116 under anhydrous conditions such as, for example, in an atmosphere of an inert gas. By way of non-limiting example, the swollen domains 126 may have a mushroom-like shape. The swollen domains 126 may be laterally spaced from one another by a distance d1. The distance d1 may be, for example, less than or equal to about 50 nm, and more specifically, in a range of from about 5 nm to about 30 nm.

In some embodiments, the swelling agent comprises polar solvent, such as an alcohol, and may be applied to form the swollen domains 126 prior to exposure to a metal oxide precursor. In additional embodiments, the swelling agent may include only the metal oxide precursor 124, or may include a mixture of a solvent, such as a polar solvent, and the metal oxide precursor 124, and may selectively solubilize or permeate the domains 118 (FIG. 2) without substantially solubilizing or substantially permeating the matrix 120. The metal oxide precursor 124 may be a metal-containing compound capable of selectively impregnating the domains 118 such as, for example, a cationic metal, a metal alkoxide, or a metal salt (e.g., a metal halide). As a non-limiting example, the metal oxide precursor 124 may be an isopropoxide, such as titanium tetraisopropoxide ($C_{12}H_{28}O_4Ti$), tetraethylorthosilicate (TEOS), or poly(dimethylsiloxane) (PDMS). The solvent may be a liquid, gas, or vapor capable of swelling or wetting the domains 118 (FIG. 2) without substantially wetting or substantially swelling the matrix 120. The solvent may include, for example, a polar organic solvent, such as an alcohol, or water, or combinations thereof. If the domains 118 are formed from the hydrophilic polymer and the matrix 120 is formed from the hydrophobic polymer, the polar solvent may permeate the hydrophilic polymer without substantially permeating the hydrophobic polymer.

By way of non-limiting example, the self-assembled film 116 (FIG. 2) may be soaked in a solvent so that the domains 118 open and swell to form swollen domains 126, as shown in FIG. 3. Thereafter, the polymer material in the swollen domains 126 may be cross-linked in this soaked, extended form. Finally, the swollen domains 126 may be exposed to the metal oxide precursor 124. By cross-linking the polymer material after formation of the swollen domains 126, buckling or wrinkling resulting from swelling may be substantially reduced or prevented.

Additionally, the swelling agent including the metal oxide precursor 124 may be applied to the self-assembled film 116 as a mixture of an alcohol, such as methanol, ethanol, or isopropanol, and titanium tetraisopropoxide having a volumetric ratio of about 2:1. As another non-limiting example, the swelling agent may be poly (dimethylsiloxane) dissolved in a solvent, which may be applied over the domains 118 by, for example, by spin-casting, and may be heated to about 80° C. and soaked for at least 6 hours to selectively permeate the domains 118.

In additional embodiments, the swelling agent may include a neat metal oxide precursor 124 such as, for example, tetraethylorthosilicate, which may be applied to the self-assembled film 116 in the absence of another solvent. Upon contact with the self-assembled film 116, the metal oxide precursor 124 of the swelling agent may be absorbed into the domains 118 (FIG. 2), forming the swollen domains 126 impregnated with the metal oxide precursor 124. The self-assembled film 116 may be exposed to the metal oxide precursor 124 for an amount of time sufficient for the metal oxide precursor 124 to impregnate the domains 118, for example, from about 30 minutes to about 5 hours and, more specifically, for about 1 hour. After formation of the swollen domains 126, the semiconductor structure 100 may, optionally, be rinsed using a solution including another solvent such as, for example, a polar organic solvent or water.

Referring still to FIG. 3, the swollen domains 126 may be exposed to an oxidizing agent (represented by directional arrows 128), which converts the metal oxide precursor 124 within the swollen domains 126 to a metal oxide (not shown). The oxidizing agent 128 may be, for example, air, oxygen, nitrogen dioxide, water, nitrogen tetroxide, ozone, or combinations thereof. By way of non-limiting example, the metal oxide precursor 124 may be exposed to the oxidizing agent 128 in a sealed chamber for a length of time in a range of from about 1 minute to about 30 hours and, more particularly, about 16 hours. By way of non-limiting example, when the metal oxide precursor 124 is titanium tetraisopropoxide, water vapor may be applied to the swollen domains 126 in a reaction chamber for about 16 hours to form titanium dioxide. As another non-limiting example, when the metal oxide precursor 124 is tetraethylorthosilicate, water vapor may be applied to the swollen domains 126 in a reaction chamber for about 16 hours to form silicon dioxide.

Figure 4:
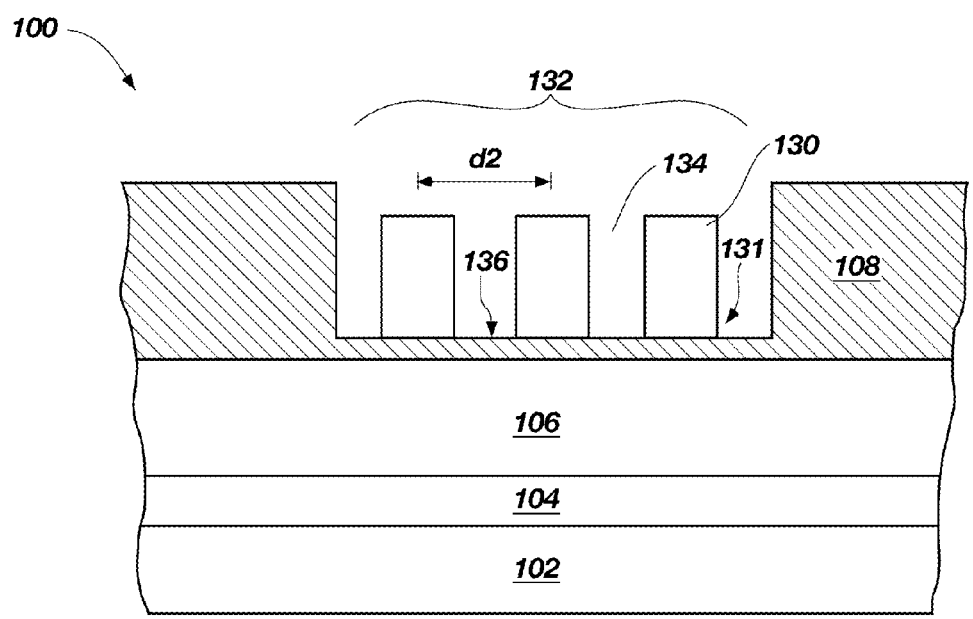
FIG. 4 is a partial cross-sectional view illustrating an embodiment of a method that may be used to fabricate metal oxide structures on a semiconductor structure.

As shown in FIG. 4, in some embodiments, a dry etching process, such as a reactive ion etching (RIE), plasma etching process, a reactive ion beam etching process, or a chemically assisted ion beam etching process, may be performed to remove a portion of the matrix 120 from the semiconductor structure 100 leaving the metal oxide structures 130. A portion of the matrix 120 may remain after etching to form a lower region 131 of each of the metal oxide structures 130. The dry etching process may be performed such that each of the metal oxide structures 130 may have an upper surface below a surface of the insulative material 108 and may include a region 131 that includes the matrix 120. As a non-limiting example, if the matrix 120 is polystyrene, an anisotropic reactive ion (i.e., plasma) etching process using oxygen as the etchant may be performed to remove the polystyrene. The dry etch may, optionally, remove at least a portion of polymer material remaining in the swollen domains 126 and the interface material 122.

Figure 5:
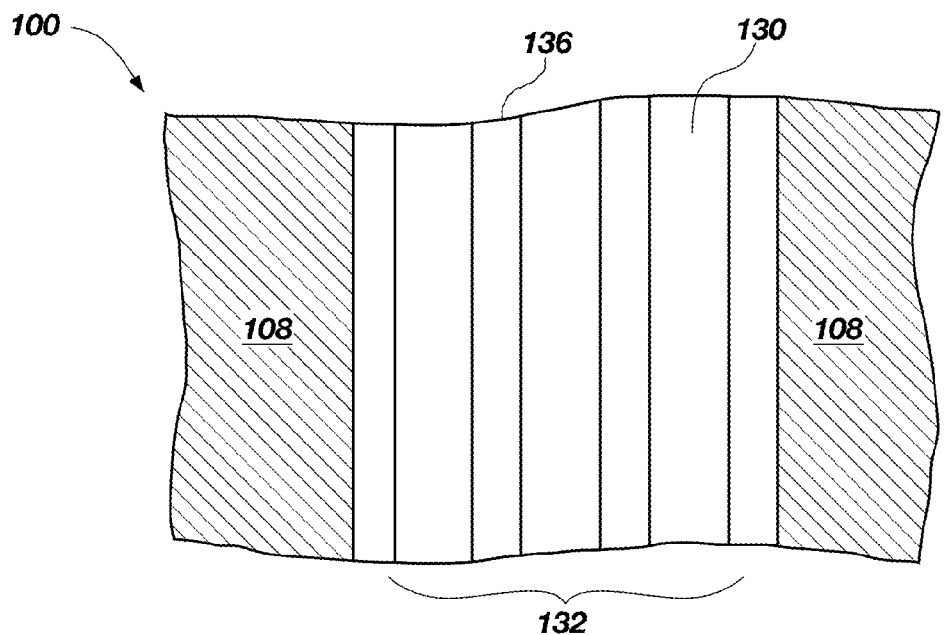
FIG. 5 is a top-down plan view of the embodiment of the semiconductor structure shown in FIG. 4.

As a result of removing the matrix 120, and optionally, the polymer material remaining in the swollen domains 126 and the interface material 122, a pattern 132 of laterally spaced metal oxide structures 130 may remain on the surface of the semiconductor structure 100. The metal oxide structures 130 may include a metal oxide material. The metal oxide structures 130 may be laterally spaced from one another by a distance d2 (i.e., the center-to-center distance between metal oxide structures 130), which may be about one-half the distance d1 (i.e., the center-to-center distance between swollen domains 126 shown in FIG. 3). A portion of the insulative material 108 may be exposed through apertures 134 between each of the metal oxide structures 130. FIG. 5 is a top-down view of the semiconductor structure 100 of FIG. 4.

Additionally, a portion of the matrix 120 may be removed using a conventional calcination process in a reactive ambient gas, such as oxygen or ammonia, to remove remaining organic residues. The resulting metal oxide structures 130 may be densified or hardened in comparison to the swelled domains 126 (FIG. 3). In addition to, or as another alternative to performing the etching process to remove the matrix 120, a conventional calcination process may be performed to remove the remaining polymer material from the swollen domains 126, the matrix 120, and the interface material 122. The calcination process may be performed, for example, by exposing the semiconductor structure 100 to temperatures at or above a decomposition temperature of the polymer material. By way of non-limiting example, the semiconductor structure 100 may be exposed to a temperature in a range of from about 300° C. to about 450° C. in a vacuum or in an inert atmosphere, such as argon or nitrogen. As another non-limiting example, the semiconductor structure 100 maybe exposed to ozone at a temperature in a range of from about 75° C. to about 95° C. The resulting semiconductor structure 100 includes laterally spaced metal oxide structures (not shown), which may have a similar structure to the metal oxide structures 130 shown in FIG. 4. Formation of the metal oxide structures 130 provides improved etch selectivity over the underlying materials in comparison to the domains 118 of the array 117 (FIG. 2) and the metal oxide-impregnated swollen domains 126 (FIG. 3). In this way, selective deposition of metal oxides into the specific regions of the self-assembled film 116 (FIG. 2) may be used to form an etching mask having feature sizes of less than or equal to 30 nm.

Figure 6:
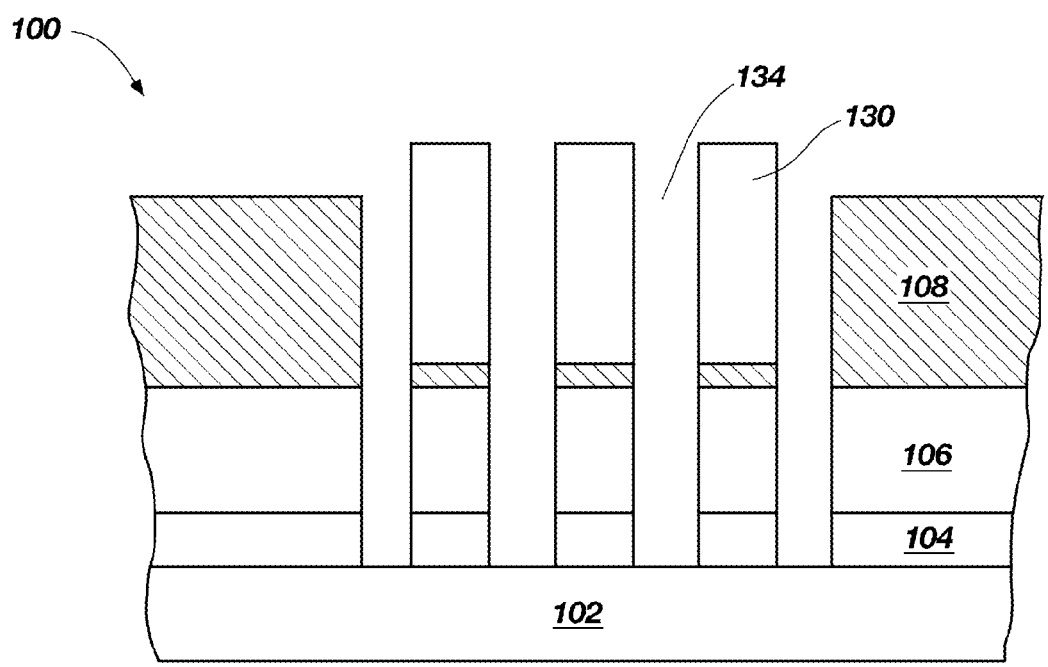
FIG. 6 is a partial cross-sectional view illustrating an embodiment of a patterning method utilizing metal oxide structures such as those fabricated using the method shown in FIGS. 1-4.

Referring to FIG. 6, because the underlying materials are selectively etchable with respect to the metal oxide structures 130, the metal oxide structures 130 may be used as a mask to pattern the underlying materials using, for example, conventional etching techniques. By way of non-limiting example, the apertures 134 between the metal oxide structures 130 may expose a surface 136 of the insulative material 108. The insulative material 108 may be removed using, for example, a dry etching process. The particular composition of the etchant used to remove the insulative material 108 exposed between apertures 134 selective to the metal oxide structures 130 may be selected based on the materials used for the insulative material 108 and the metal oxide structures 130. As a non-limiting example, if the insulative material 108 is silicon dioxide, a conventional dry etching process may be used to selectively remove the insulative material 108 without removing the metal oxide structures 130, exposing the underlying semiconductive material 106.

After removing the exposed portion of the insulative material 108, a portion of the semiconductive material 106 exposed through the apertures 134 may be selectively removed with respect to the metal oxide structures 130 using a dry plasma reactive ion etching (RIE) process. Subsequently, the underlying dielectric material 104 exposed through the apertures 134 may be removed using, for example, a dry plasma reactive ion etching (RIE) process. The semiconductive material 106 and the dielectric material 104 exposed through the apertures 134 may be removed using a single dry etching process or multiple dry etching processes.

The following examples serve to illustrate embodiments of the present invention in more detail. These examples are not to be construed as being exhaustive or exclusive as to the scope of this invention.

EXAMPLES

In each of the examples, a sample including a self-assembled film formed within trenches in a silicon dioxide material was used. To form the sample, a plurality of trenches having a width of about 200 nm were formed in a silicon dioxide material over and in contact with a polycrystalline silicon substrate using conventional deposition process and patterning processes. A polystyrene-block-polyvinylpyridine block (PS-b-PVP) copolymer material was spin-cast over the plurality of trenches in the silicon dioxide material to fill each of the trenches. The PS-b-PVP block copolymer was then heated to a temperature of about 200° C. to anneal the PS-b-PVP into a self-assembled film including ordered polyvinylpyridine (PVP) domains surrounded by a polystyrene (PS)

matrix within each of the plurality of trenches. Each of the ordered PVP domains may have a width of about 20 nm.

Example 1

After annealing the PS-b-PVP block copolymer material, the sample was immersed in tetraethylorthosilicate for about 2 hours at a temperature of about 25° C. in air ambient while the tetraethylorthosilicate was absorbed into the PVP block polymer without substantially absorbing into the PS matrix, which caused swelling of the PVP block polymer.

Excess tetraethylorthosilicate (i.e., tetraethylorthosilicate which was not absorbed into the PVP block polymer) was removed from the sample using a spin-off process performed at about 3000 RPM for about 3 minutes. The tetraethylorthosilicate within the PVP block polymer was immersed and stirred in a deionized water bath for about 10 minutes at a temperature of about 70° C. to form silicon dioxide lines.

A rapid thermal anneal was performed to develop the silicon dioxide lines exposing the silicon dioxide lines to ozone at a temperature of about 85° C. for about 10 minutes and, thereafter, performing an oxygen plasma etching process for about 20 seconds.

Example 2

After annealing the PS-b-PVP block copolymer material, the sample was placed in a solution including a mixture of 2 parts by volume ethanol and 1 part by volume titanium tetra (isopropoxide). For about 1 hour, the self-assembled film was exposed to the ethanol/titanium tetra(isopropoxide) solution, which permeated the PVP block copolymer without substantially permeating the PS matrix, causing the ordered PVP domains to swell.

After exposure to the ethanol/titanium tetra (isopropoxide) solution, the self-assembled film was rinsed with ethanol to remove residual polymer material and was air dried. The sample was then exposed to water vapor at a temperature of about 25° C. for about 16 hours, which resulted in conversion of titanium tetra (isopropoxide) to titanium oxide within the ordered PVP domains.

Figure 7:
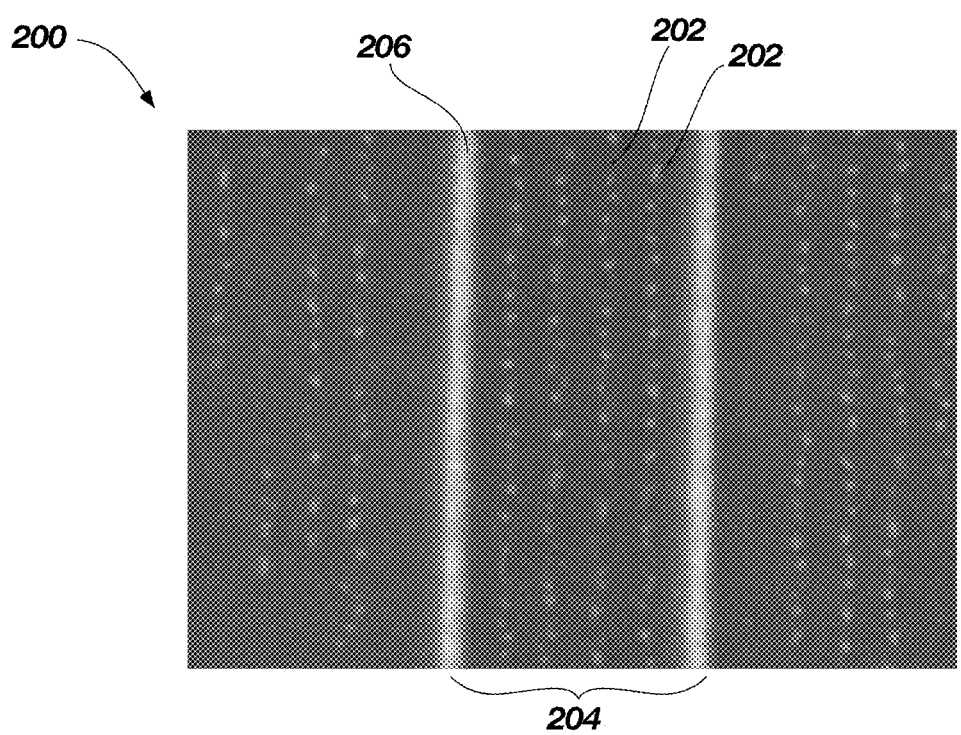
FIG. 7 is a scanning electron micrograph showing a top-down plan view of metal oxide lines formed on a semiconductor structure using embodiments of the present invention.

A reactive ion etching process was performed using oxygen gas at a flow rate of about 20 sccm, a pressure of 50 mTorr, at about 34 Watts for about 120 seconds to remove the PS from the sample. To removed residues and reveal titanium oxide lines, an etching process using tetrafluoromethane ($CF_4$) gas at a flow rate of about 100 sccm was performed. FIG. 7 is an SEM image showing a top-down view of the sample 200 having titanium dioxide lines 202 within trenches 204 thereon. Each of the titanium dioxide lines 202 is horizontally aligned with sidewalls 206 of the trenches 204.

Example 3

After annealing, the sample was exposed to a solution of tetraethylorthosilicate at about 24.0° C. for about 1 hour to enable the tetraethylorthosilicate to selectively penetrate the PVP domains The sample was then exposed to water vapor at a temperature of about 60.0° C. in the sealed reactor chamber for about 16 hours. After exposure to the water vapor, the TEOS within the PVP domains had been converted to silicon dioxide to form a plurality of silicon dioxide lines in the trenches.

A reactive ion etching process was performed using oxygen gas at a flow rate of about 20 sccm, a pressure of 50 mTorr, at about 34 Watts for about 120 seconds to remove the PS from the sample revealing silicon dioxide lines.

Example 4

After annealing the PS-b-PVP block copolymer material, a layer of tetraethylorthosilicate was applied over the self-assembled film for about 2 hours to enable the tetraethylorthosilicate to permeate the PVP domains. Excess tetraethylorthosilicate was removed by spinning the sample at about 3000 rpm for about 3 seconds. Immediately after removal of the tetraethylorthosilicate, the sample was immersed in water at a temperature of about 70.0° C. for about 10 minutes.

The sample was dried and exposed to a vapor stream including 10% ozone/oxygen and was heated to a temperature of about 85.0° C. for about 10 minutes. The sample was dried and exposed to an oxygen plasma at a pressure of about 100 mTorr, at about 300 Watts for about 20 seconds. After treatment with the oxygen plasma, silicon dioxide lines were revealed in the PVP domains.

While the invention may be susceptible to various modifications and alternative forms, specific embodiments have been shown by way of example in the drawings and have been described in detail herein. However, it should be understood that the invention is not limited to the particular forms disclosed. Rather, the invention encompasses all modifications, variations and alternatives falling within the scope of the invention as defined by the following appended claims and their legal equivalents.

What is claimed is:

1. A semiconductor device structure comprising:
   at least one trench in an insulative material overlying a substrate; and
   metal oxide structures within the at least one trench and comprising at least one of lamellas and cylinders, each of the metal oxide structures substantially equally laterally spaced from at least one other of the metal oxide structures and comprising:
      an upper region comprising at least one polymer and a metal oxide; and
      a lower region between the upper region and the substrate and comprising at least on other polymer.

2. The semiconductor device structure of claim 1, wherein the upper region of each of the metal oxide structures comprises polyvinylpyridine and the metal oxide.

3. The semiconductor device structure of claim 1, wherein each of the metal oxide structures is positioned substantially parallel to sidewalls of the at least one trench.

4. The semiconductor device structure of claim 1, wherein the metal oxide structures comprise from about two metal oxide structures to about fifty metal oxide structures.

5. The semiconductor device structure of claim 1, wherein the metal oxide structures comprise the cylinders, each of the cylinders having a diameter within a range of from about 5 nm to about 50 nm.

6. The semiconductor device structure of claim 1, wherein each of the metal oxide structures has a length substantially equal to a length of the at least one trench.

7. The semiconductor device structure of claim 1, wherein the at least one polymer is substantially hydrophilic.

8. The semiconductor device structure of claim 1, wherein the at least one polymer comprises at least one of polyvinylpyridine, hydroxypropyl methylcellulose, polyethylene glycol, poly(ethylene oxide)-co-poly(propylene oxide), poly (ethylene oxide), poly(vinyl alcohol), poly(ethylene-co-vinyl alcohol), poly(acrylic acid), poly(ethyloxazoline), a poly (alkylacrylate), poly(acrylamide), a poly(N-alkylacrylamide), a poly(N,N-dialkylacrylamide), poly(propylene glycol), poly(propylene oxide), partially hydrolyzed poly(vinyl alcohol), fully hydrolyzed poly(vinyl alcohol), dextran, and copolymers thereof.

9. The semiconductor device structure of claim 1, wherein the metal oxide comprises at least one of titanium dioxide and silicon dioxide.

10. The semiconductor device structure of claim 1, wherein the at least one trench has a depth within a range of from about 15 nm to about 50 nm.

11. The semiconductor device structure of claim 1, further comprising:
    a dielectric material over and in contact with the substrate; and
    a semiconductive material between the dielectric material and the insulative material.

12. A semiconductor device structure comprising:
    structural domains within at least one trench in an insulative material overlying a substrate, each of the structural domains comprising:
        a first polymer block of a block copolymer material; and
        a metal oxide within the first polymer block; and
    a matrix between the structural domains and the substrate and comprising a second polymer block of the block copolymer material.

13. The semiconductor device structure of claim 12, wherein the first polymer block comprises a hydrophilic polymer.

14. The semiconductor device structure of claim 12, further comprising a conformal film of dielectric material on surfaces of the at least one trench.

15. The semiconductor device structure of claim 12, wherein the matrix comprises a hydrophobic polymer.

16. The semiconductor device structure of claim 12, wherein the matrix comprises at least one of polystyrene, polyethylene, polypropylene, polychloroprene, a polyvinyl ether, poly(vinyl acetate), poly(vinyl chloride), a polysiloxane, a polyurethane, a polyacrylate, a polyacrylamide, and copolymers thereof.

17. A semiconductor device structure comprising:
    an insulative material over a substrate; and
    substantially equally laterally spaced polymer structures within at least one trench in the insulative material, each of the substantially equally laterally spaced polymer structures comprising:
        an upper region comprising a metal oxide; and
        a lower region substantially free of the metal oxide and comprising a polymer.

18. The semiconductor device structure of claim 17, wherein at least one of the substantially equally laterally spaced polymer structures comprises polymer blocks of a block copolymer selected from the group consisting of polystyrene-block-polyvinylpyridine, polystyrene-block-polymethylmethacrylate, polyethyleneoxide-block-polyisoprene, polyethyleneoxide-block-polybutadiene, polyethyleneoxide-block-polystyrene, polyethyleneoxide-block-polymethylmethacrylate, polyethyleneoxide-block-polyethylethylene, polystyrene-block-polyisoprene, polystyrene-block-polybutadiene, polystyrene-block-polyferrocenyldimethylsilane, polybutadiene-block-polyvinylpyridine, and polyisoprene-block-polymethylmethacrylate.

19. The semiconductor device structure of claim 1, wherein the at least one polymer comprises at least one polymer block of a block copolymer, and wherein the at least one other polymer comprises at least one other polymer block of the block copolymer.

20. The semiconductor device structure of claim 17, wherein the upper region of each of the substantially equally laterally spaced polymer structures is substantially free of the polymer.

* * * * *

UNITED STATES PATENT AND TRADEMARK OFFICE
CERTIFICATE OF CORRECTION

| | | |
|---|---|---|
| PATENT NO. | : 8,669,645 B2 | Page 1 of 1 |
| APPLICATION NO. | : 13/335107 | |
| DATED | : March 11, 2014 | |
| INVENTOR(S) | : Dan B. Millward et al. | |

It is certified that error appears in the above-identified patent and that said Letters Patent is hereby corrected as shown below:

In the Claims

In column 12, line 42, in Claim 1, delete "on" and insert -- one --, therefor.

Signed and Sealed this
Fourth Day of November, 2014

Michelle K. Lee
*Deputy Director of the United States Patent and Trademark Office*